(12) United States Patent
Huang et al.

(10) Patent No.: US 11,211,287 B2
(45) Date of Patent: Dec. 28, 2021

(54) SEMICONDUCTOR DEVICE AND METHOD FOR FABRICATING THE SAME

(71) Applicant: NANYA TECHNOLOGY CORPORATION, New Taipei (TW)

(72) Inventors: Tse-Yao Huang, Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/517,903

(22) Filed: Jul. 22, 2019

(65) Prior Publication Data
US 2021/0028053 A1 Jan. 28, 2021

(51) Int. Cl.
| H01L 21/764 | (2006.01) |
| H01L 23/522 | (2006.01) |
| H01L 23/10 | (2006.01) |
| H01L 21/50 | (2006.01) |
| H01L 21/02 | (2006.01) |

(52) U.S. Cl.
CPC ...... *H01L 21/764* (2013.01); *H01L 21/02123* (2013.01); *H01L 21/02381* (2013.01); *H01L 21/50* (2013.01); *H01L 23/10* (2013.01); *H01L 23/5226* (2013.01)

(58) Field of Classification Search
CPC .................................................. H01L 21/764
See application file for complete search history.

(56) References Cited

U.S. PATENT DOCUMENTS

| 9,412,650 B2 * | 8/2016 | Chen .................. H01L 21/76831 |
| 2009/0298256 A1 * | 12/2009 | Chen .................... H01L 21/7682 |
| | | 438/421 |
| 2015/0214220 A1 | 7/2015 | Seo et al. |

(Continued)

FOREIGN PATENT DOCUMENTS

| TW | 200952117 A | 12/2009 |
| TW | 200952117 A | 12/2009 |

(Continued)

OTHER PUBLICATIONS

Office Action issued in corresponding TW application No. 108145990 dated Aug. 31, 2020.

(Continued)

*Primary Examiner* — Robert K Carpenter
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a semiconductor substrate, a plurality of first set conductive elements separately positioned above the semiconductor substrate, a plurality of insulating blocks respectively correspondingly positioned between adjacent pairs of the plurality of first set conductive elements, a plurality of first set supporting pillars respectively correspondingly positioned between adjacent pairs of the plurality of first set conductive elements and respectively correspondingly positioned over the plurality of insulating blocks, and a plurality of spaces respectively correspondingly positioned adjacent to the plurality of first set supporting pillars and respectively correspondingly positioned over the plurality of insulating blocks.

18 Claims, 32 Drawing Sheets

(56) References Cited

U.S. PATENT DOCUMENTS

2015/0287676 A1* 10/2015 Rha .................. H01L 23/53266
257/773
2018/0083099 A1    3/2018 Baek et al.
2019/0207008 A1    7/2019 Yu et al.

FOREIGN PATENT DOCUMENTS

TW    201721741 A    6/2017
TW    201834079 A    9/2018

OTHER PUBLICATIONS

Office Action dated May 1, 2020 related to Taiwanese Application No. 108145990.

* cited by examiner

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with space (air gap) and a method for fabricating the semiconductor device with space.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device comprises: a semiconductor substrate; a plurality of first set conductive elements separately positioned above the semiconductor substrate; a plurality of insulating blocks respectively correspondingly positioned between adjacent pairs of the plurality of first set conductive elements; a plurality of first set supporting pillars respectively correspondingly positioned between adjacent pairs of the plurality of first set conductive elements and respectively correspondingly positioned over the plurality of insulating blocks; and a plurality of spaces respectively correspondingly positioned adjacent to the plurality of first set supporting pillars and respectively correspondingly positioned over the plurality of insulating blocks.

In some embodiments, the semiconductor device further comprises a first sealing layer, wherein the first sealing layer is positioned above the plurality of first set conductive elements.

In some embodiments, the plurality of first set conductive elements are formed of metal, metal alloy, silicate, silicide, polysilicon, or amorphous silicon.

In some embodiments, the plurality of first set supporting pillars are formed of an undoped oxide.

In some embodiments, the first sealing layer is formed of silicon oxide, silicon nitride, spin-on glass, silicon oxynitride, or silicon nitride oxide.

In some embodiments, a width of one of the plurality of spaces is less than or equal to one-fourth of a horizontal distance between an adjacent pair of the plurality of first set conductive elements.

In some embodiments, the plurality of first set supporting pillars and the plurality of insulating blocks are made of undoped oxide.

In some embodiments, a horizontal distance between one of the plurality of first conductive vias and an adjacent one of the plurality of spaces is less than about 50 nm.

In some embodiments, the first sealing layer comprises a plurality of protrusions occupying top portions of the plurality of spaces.

In some embodiments, a bottom end of the plurality of protrusions is lower than a top end of the plurality of first set conductive elements.

Another aspect of the present disclosure provides a semiconductor device. The semiconductor device comprises: a semiconductor substrate; a first conductive element positioned above the semiconductor substrate; a second conductive element positioned above the semiconductor substrate and separated from the first conductive element; an insulating block positioned above the semiconductor substrate and between the first conductive element and the second conductive element; a third conductive element positioned above the semiconductor substrate and opposite to the first conductive element with the second conductive element interposed therebetween; a first supporting pillar positioned above the insulating block and between the first conductive element and the second conductive element; a first space positioned above the insulating block and between the first conductive element and the first supporting pillar; and a second space positioned above the insulating block and between the second conductive element and the first supporting pillar.

In some embodiments, the first conductive element is formed of metal, metal alloy, silicate, silicide, polysilicon, or amorphous silicon.

In some embodiments, the first supporting pillar and the insulating block are formed of an undoped oxide.

In some embodiments, the semiconductor device further comprises a first sealing layer, wherein the first sealing layer is positioned above the first conductive element, the second conductive element, the third conductive element, and the first supporting pillar.

In some embodiments, the first sealing layer is formed of silicon oxide, silicon nitride, spin-on glass, silicon oxynitride, or silicon nitride oxide.

In some embodiments, the first sealing layer comprises a plurality of protrusions occupying top portions of the plurality of spaces In some embodiments, a bottom end of the plurality of protrusions is lower than a top end of the plurality of first set conductive elements.

In some embodiments, a width of the first space is less than or equal to one-fourth of a horizontal distance between the first conductive element and the second conductive element.

Another aspect of the present disclosure provides a method for fabricating a semiconductor device. The method comprises: providing a substrate; forming a first insulating film on the substrate; forming a plurality of temporary patterns above the first insulating film and a plurality of insulating blocks respectively correspondingly positioned between adjacent pairs of the plurality of the temporary patterns; forming a plurality of sacrificial layers along sidewalls of the plurality of first conductive layers and respectively correspondingly positioned over the plurality of insulating blocks; forming a plurality of supporting pillars respectively correspondingly positioned between adjacent pairs of the plurality of sacrificial layers and respectively correspondingly positioned over the plurality of insulating blocks; removing plurality of temporary patterns and forming a plurality of recesses in the places previously occupied by the plurality of sacrificial layers; forming a plurality of first conductive layers by filling the plurality of recesses with a conductive material; and removing the plurality of sacrificial layers and forming a plurality of spaces in the places previously occupied by the plurality of sacrificial layers; wherein a width of one of the plurality of sacrificial layers is less than or equal to one-fourth of a horizontal distance between an adjacent pair of the plurality of first conductive layers.

In some embodiments, the method for fabricating the semiconductor device further comprises: forming a first sealing layer above the plurality of supporting pillars after removing the plurality of sacrificial layers and forming the plurality of spaces in the locations previously occupied by the plurality of sacrificial layers.

Due to the design of the semiconductor device of the present disclosure, the resistive-capacitive delay induced by the parasitic capacitance originating from adjacent conductive elements may be alleviated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
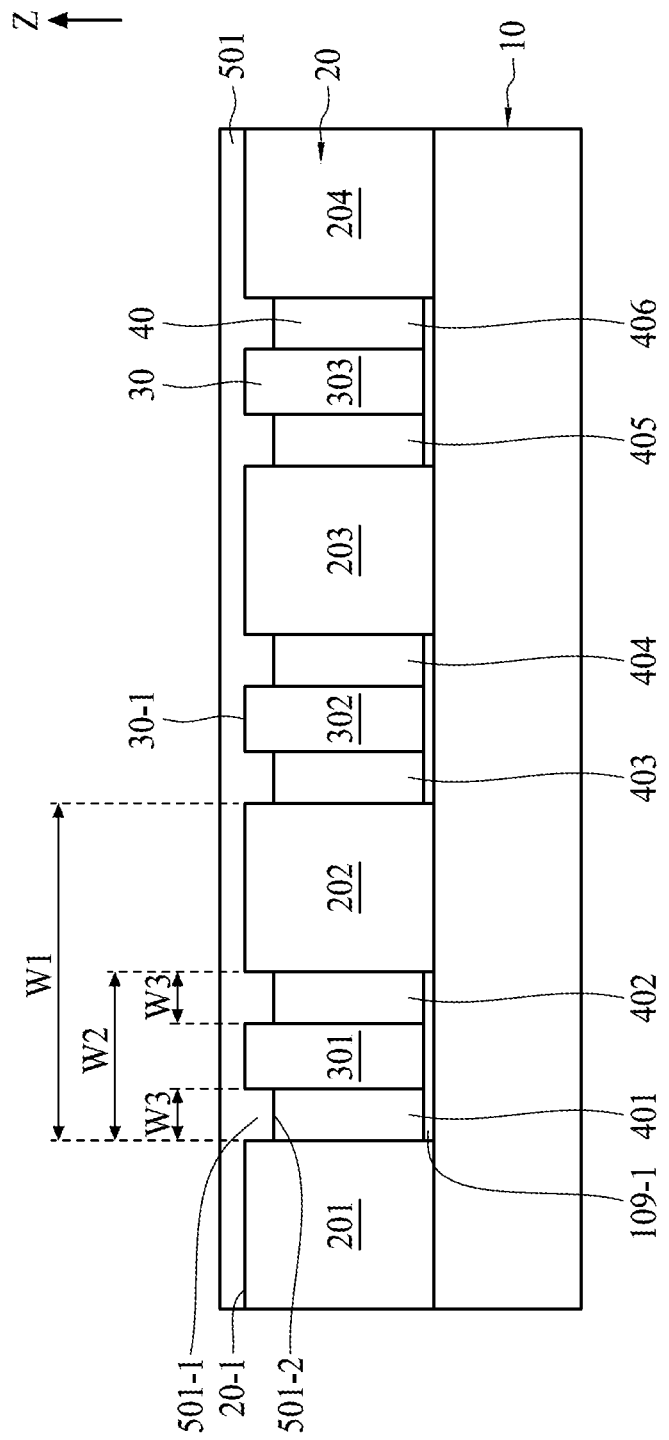
FIGS. 1 to 9 illustrate, in schematic cross-sectional diagrams, some semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

Note that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional diagram, a portion of a semiconductor device of one embodiment of the present disclosure.

With reference to FIG. 1, the semiconductor device includes a semiconductor substrate 10, a plurality of first set conductive elements 20, a plurality of first set supporting pillars 30, a plurality of spaces 40, and a first sealing layer 501.

With reference to FIG. 1, the semiconductor substrate 10 may, for example, contain semiconductor elements such as transistors, diodes, or the like. The semiconductor substrate 10 may also contain insulating layers and conductive elements that are disposed among the insulating layers and are electrically connected to the semiconductor elements. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or II-VI semiconductor material.

With reference to FIG. 1, the plurality of first set conductive elements 20 are separately disposed above the semiconductor substrate 10 and are electrically coupled to the semiconductor elements contained in the semiconductor substrate 10 or the conductive elements contained in the semiconductor substrate 10. The plurality of first set conductive elements 20 may be, for example, contacts in the front end of line of the semiconductor device, or metal lines in the back end of line of the semiconductor device.

With reference to FIG. 1, in the embodiment depicted, the plurality of first set conductive elements 20 includes a first conductive element 201, a second conductive element 202, a third conductive element 203, and a fourth conductive element 204. The first conductive element 201 is disposed on the semiconductor substrate 10 and is electrically coupled to the semiconductor elements contained in the semiconductor substrate 10 or the conductive elements contained in the semiconductor substrate 10. The second conductive element 202 is disposed on the semiconductor substrate 10 and is electrically coupled to the semiconductor elements contained in the semiconductor substrate 10 or the conductive elements contained in the semiconductor substrate 10. The second conductive element 202 is separated from the first conductive element 201. The third conductive element 203 is disposed on the semiconductor substrate 10 and is electrically coupled to the semiconductor elements contained in the semiconductor substrate 10 or the conductive elements contained in the semiconductor substrate 10. The third conductive element 203 is opposite to the first conductive element 201 with the second conductive element 202 interposed therebetween. The fourth conductive element 204 is disposed on the semiconductor substrate 10 and is electrically coupled to the semiconductor elements contained in the semiconductor substrate 10 or the conductive elements contained in the semiconductor substrate 10. The fourth conductive element 204 is opposite to the second conductive element 202 with the third conductive element 203 interposed therebetween. A horizontal distance W2 between a right sidewall of the first conductive element 201 and a left sidewall of the second conductive element 202 is less than or equal to a horizontal distance W1 between the right sidewall of the first conductive element 201 and a right sidewall of the second conductive element 202.

The plurality of first set conductive elements 20 may be formed of, for example, metal, metal alloy, silicate, silicide, polysilicon, amorphous silicon, or any other semiconductor-compatible conductive material. Specifically, in the embodiment depicted, the first conductive element 201, the second conductive element 202, the third conductive element 203, and the fourth conductive element 204 are formed of, for example, metal, metal alloy, silicate, silicide, polysilicon, amorphous silicon, or any other semiconductor-compatible conductive material. The metal is, for example, aluminum, tungsten, or copper. The metal alloy is, for example, copper alloy which may be formed of copper and at least one of the elements selected from the group consisting of carbon, silver, zinc, aluminum, titanium, cobalt, tantalum, indium, sin, zinc, manganese, magnesium, chromium, germanium, strontium, platinum, and zirconium.

With reference to FIG. 1, the plurality of first set supporting pillars 30 are disposed above the semiconductor substrate 10 and are respectively correspondingly disposed between adjacent pairs of the plurality of first set conductive elements 20. In the embodiment depicted, a plurality of insulating blocks 109-1 are disposed between the plurality of first set supporting pillars 30 and the substrate. In some embodiments, the plurality of insulating blocks 109-1 are made of undoped oxide. In some embodiments, the height of the plurality of insulating blocks 109-1 is less than that of the plurality of first set conductive elements 20. In the embodiment depicted, the plurality of first set supporting pillars 30 includes a first supporting pillar 301, a second supporting pillar 302, and a third supporting pillar 303.

With reference to FIG. 1, the first supporting pillar 301 is disposed between the first conductive element 201 and the second conductive element 202. The second supporting pillar 302 is disposed between the second conductive element 202 and the third conductive element 203. The third supporting pillar 303 is disposed between the third conductive element 203 and the fourth conductive element 204. The plurality of first set supporting pillars 30 may be formed of an undoped oxide such as silicon oxide or undoped silicon glass. Specifically, the first supporting pillar 301, the second supporting pillar 302, and the third supporting pillar 303 are formed of an undoped oxide such as silicon oxide or undoped silicon glass.

With reference to FIG. 1, alternatively, in another embodiment depicted, the plurality of first set supporting pillars 30 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but are not limited thereto. Specifically, the first supporting pillar 301, the second supporting pillar 302, and the third supporting pillar 303 are formed of silicon nitride, silicon oxide, silicon oxynitride, silicon nitride oxide, flowable oxide, undoped silica glass, borosilica glass, phosphosilica glass, borophosphosilica glass, fluoride silicate glass, carbon doped silicon oxide, xerogel, aerogel, organo silicate glass, polyimide, porous polymeric material, or a combination thereof, but are not limited thereto.

Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, alternatively, in another embodiment depicted, the plurality of first set supporting pillars 30 may be formed of a low-dielectric-constant material having a dielectric constant lower than 3.0. Specifically, the first supporting pillar 301, the second supporting pillar 302, and the third supporting pillar 303 are formed of a low-dielectric-constant material having a dielectric constant lower than 3.0.

With reference to FIG. 1, the plurality of spaces 40 are respectively correspondingly disposed adjacent to the plurality of first set supporting pillars 30. In the embodiment depicted, the plurality of spaces 40 includes a first space 401, a second space 402, a third space 403, a fourth space 404, a fifth space 405, and a sixth space 406.

With reference to FIG. 1, the first space 401 is disposed between the first conductive element 201 and the first supporting pillar 301. A width W3 of the first space 401 is less than or equal to the horizontal distance W2 between the right sidewall of the first conductive element 201 and the left sidewall of the second conductive element 202. The second space 402 is disposed between the first supporting pillar 301 and the second conductive element 202. A width of the second space 402 is substantially equal to the width W3 of the first space 401. The third space 403 is disposed between the second conductive element 202 and the second supporting pillar 302. A width of the third space 403 is substantially equal to the width W3 of the first space 401. The fourth space 404 is disposed between the second supporting pillar 302 and the third conductive element 203. A width of the fourth space 404 is substantially equal to the width W3 of the first space 401. The fifth space 405 is disposed between the third conductive pillar 203 and the third supporting pillar 303. A width of the fifth space 405 is substantially equal to the width W3 of the first space 401. The sixth space 406 is disposed between the third supporting pillar 303 and the fourth conductive element 204. A width of the sixth space 406 is substantially equal to the width W3 of the first space 401. The plurality of spaces 40 may be filled with air or nitrogen and have a dielectric constant of approximately 1.0. Specifically, the first space 401, the second space 402, the third space 403, the fourth space 404, the fifth space 405, and the sixth space 406 may be filled with air or nitrogen and respectively have a dielectric constant of approximately 1.0.

With reference to FIG. 1, the first sealing layer 501 is disposed above the plurality of first set conductive elements 20 and the plurality of first set supporting pillars 30. The first sealing layer 501 may seal the plurality of spaces 40. In the embodiment depicted, the first sealing layer 501 is disposed on the first conductive element 201 the second conductive element 202, the third conductive element 203, the fourth conductive element 204, the first supporting pillar 301, the second supporting pillar 302, and the third supporting pillar 303. The first sealing layer 501 may seal the first space 401, the second space 402, the third space 403, the fourth space 404, the fifth space 405, and the sixth space 406.

The first sealing layer 501 may be formed of, for example, an insulating material such as silicon oxide, silicon nitride, spin-on glass, silicon oxynitride, silicon nitride oxide, or the like. Note that the term "seal" can mean either sealing the plurality of spaces 40 without filling the plurality of spaces 40 with any of the material formed of the first sealing layer 501, or sealing the plurality of spaces 40 while partially filling the plurality of spaces 40 with some of the material formed of the first sealing layer 501. A thickness of the first sealing layer may be about 1000 Angstroms to about 5000 Angstroms. However, the thickness of the first sealing layer 501 may be set to an arbitrary range depending on the circumstances.

Due to the design of the plurality of spaces 40 disposed among the plurality of first set conductive elements 20, the resistive-capacitive delay induced by the parasitic capacitance originating from adjacent conductive elements may be alleviated. In addition, the plurality of first set supporting pillars 30 also ensure the mechanical strength of the semiconductor device for the subsequent semiconductor process such as deposition, etching, polishing, packaging, etc.

With reference to FIG. 1, in some embodiments, the first sealing layer 501 comprises a first protruding portion 501-1 partially occupying the top portions of the spaces 401, 402, 403, 404, 405, 406. In some embodiments, the bottom end 501-2 of the first protruding portion 501-1 is lower than the top end 20-1 of the conductive elements 201, 202, 203, 204. In some embodiments, the bottom end 502-2 of the first protruding portion 501-1 is lower than the top end 30-1 of the supporting pillars 301, 302, 303. In some embodiments, the first protruding portion 501-1 is integrally formed with the first sealing layer 501 to prevent the first sealing layer 501 from peeling off from the supporting pillars 301, 302, 303 and the conductive elements 201, 202, 203, 204.

Figure 2:
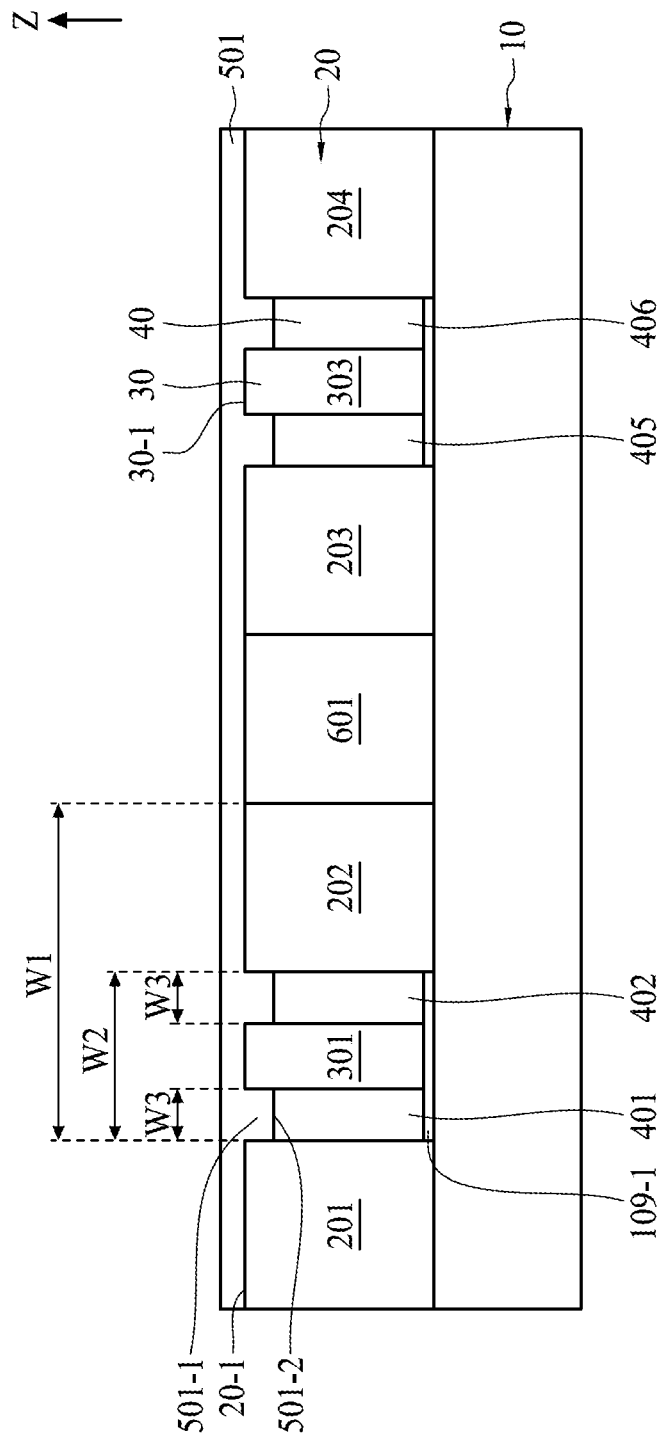

FIG. 2 illustrates, in a schematic cross-sectional diagram, a portion of a semiconductor device of another embodiment of the present disclosure.

With reference to FIG. 2, the semiconductor device includes a first insulating layer 601. The first insulating layer 601 is disposed between the second conductive element 202 and the third conductive element 203. The first insulating layer 601 directly contacts a right sidewall of the second conductive element 202 and a left sidewall of the third conductive element 203. In particular, not every adjacent pair of the plurality of first set conductive elements 20 is separated by a space. A coverage rate of the plurality of spaces 40 and the sum of the plurality of first set conductive elements 20 and the plurality of first set supporting pillars 30 is about 42% to about 53%.

The first insulating layer 601 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. The presence of the first insulating layer 601 may increase the mechanical strength of the semiconductor device.

Figure 3:
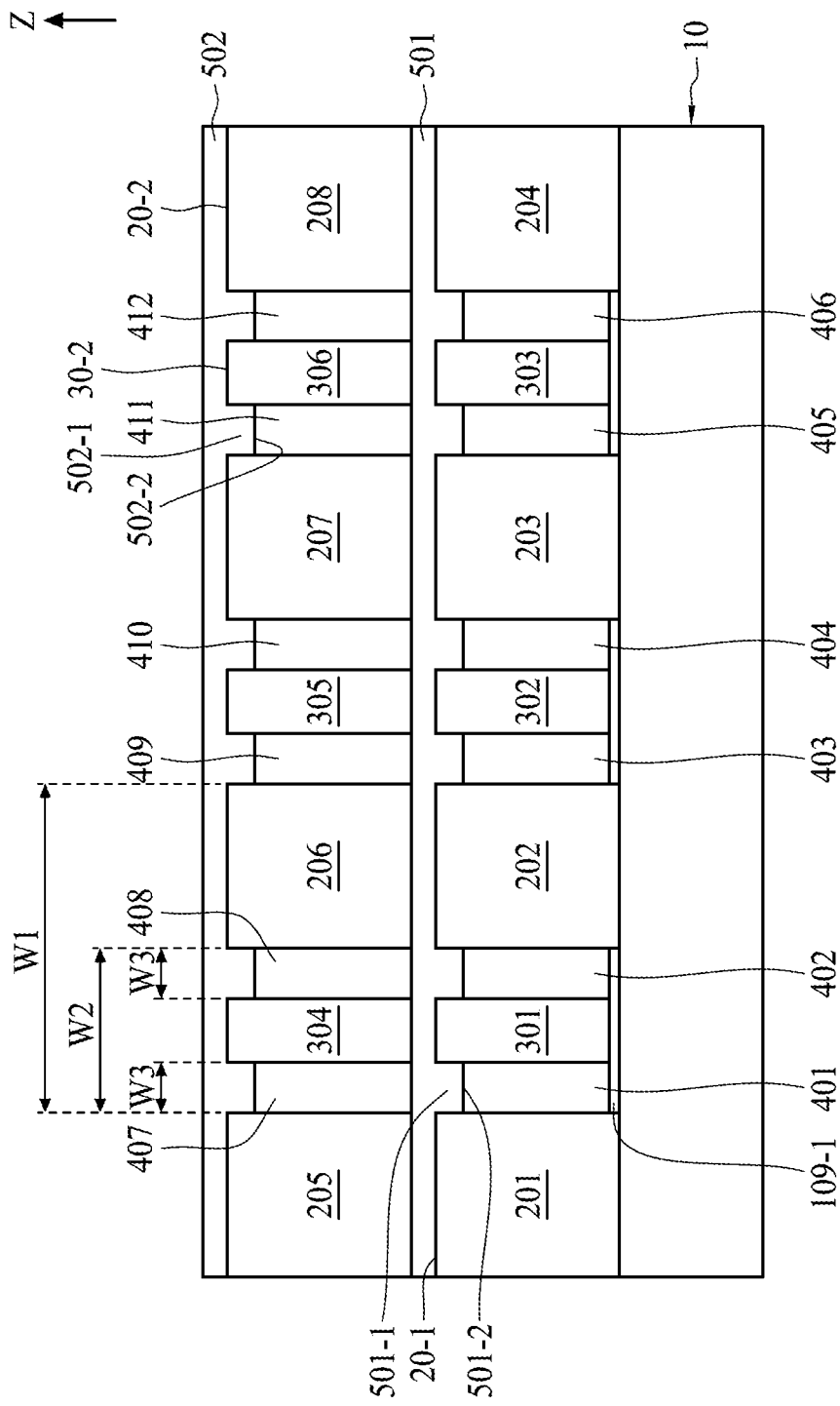

FIG. 3 illustrates, in a schematic cross-sectional diagram, a portion of a semiconductor device of another embodiment of the present disclosure.

With reference to FIG. 3, the semiconductor device further includes a plurality of second set conductive elements, a plurality of second set supporting pillars, and a second sealing layer 502. The plurality of spaces 40 further include a seventh space 407, an eighth space 408, a ninth space 409, a tenth space 410, an eleventh space 411, and a twelfth space 412. The plurality of second set conductive elements may be electrically coupled to the plurality of first set conductive elements 20 and include a fifth conductive element 205, a sixth conductive element 206, a seventh conductive element 207, and an eighth conductive element 208. The plurality of second set supporting pillars include a fourth supporting pillar 304, a fifth supporting pillar 305, and a sixth supporting pillar 306.

With reference to FIG. 3, the fifth conductive element 205, the sixth conductive element 206, the seventh conductive element 207, and the eighth conductive element 208 are disposed on the first sealing layer 501 and are separated from each other. The fourth supporting pillar 304, the fifth supporting pillar 305, and the sixth supporting pillar 306 are disposed on the first sealing layer 501 and are separated from each other. The fourth supporting pillar 304 is disposed between the fifth conductive element 205 and the sixth conductive element 206. The fifth supporting pillar 305 is disposed between the sixth conductive element 206 and the seventh conductive element 207. The sixth supporting pillar 306 is disposed between the seventh conductive element 207 and the eighth conductive element 208.

With reference to FIG. 3, the seventh space 407 is disposed between the fifth conductive element 205 and the fourth supporting pillar 304. The eighth space 408 is disposed between the fourth supporting pillar 304 and the sixth conductive element 206. The ninth space 409 is disposed between the sixth conductive element 206 and the fifth supporting pillar 305. The tenth space 410 is disposed between the fifth supporting pillar 305 and the seventh conductive element 207. The eleventh space 411 is disposed between the seventh conductive element 207 and the sixth supporting pillar 306. The twelfth space 412 is disposed between the sixth supporting pillar 306 and the eighth conductive element 208. The second sealing layer 502 is disposed above the fifth conductive element 205, the sixth conductive element 206, the seventh conductive element 207, the eighth conductive element 208, the fourth supporting pillar 304, the fifth supporting pillar 305, and the sixth supporting pillar 306. The second sealing layer 502 may seal the seventh space 407, the eighth space 408, the ninth space 409, the tenth space 410, the eleventh space 411, and the twelfth space 412.

The plurality of second set conductive elements may be formed of, for example, metal, metal alloy, silicate, silicide, polysilicon, amorphous silicon, or any other semiconductor-compatible conductive material. The plurality of second set conductive elements may be formed of the same material as the plurality of first set conductive elements 20, but are not limited thereto. The plurality of second set supporting pillars may be formed of an undoped oxide such as silicon oxide or undoped silicon glass. The plurality of second set supporting pillars may be formed of the same material as the plurality of first set supporting pillars 30, but are not limited thereto. The seventh space 407, the eighth space 408, the ninth space 409, the tenth space 410, the eleventh space 411, and the twelfth space 412 may be filled with air or nitrogen and respectively have a dielectric constant of approximately 1.0. The second sealing layer 502 may be formed of, for example, an insulating material such as silicon oxide, silicon nitride, spin-on glass, silicon oxynitride, silicon nitride oxide, or the like.

Alternatively, in another embodiment depicted, the plurality of second set supporting pillars may be formed of, for example, silicon nitride, silicon oxide, silicon oxynitride, silicon nitride oxide, flowable oxide, toners silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but are not limited thereto. The presence of the seventh space 407, the eighth space 408, the ninth space 409, the tenth space 410, the eleventh space 411, and the twelfth space 412 disposed among the plurality of second set conductive elements may alleviate the resistive-capacitive delay induced by the parasitic capacitance originating from adjacent conductive elements.

With reference to FIG. 3, in some embodiments, the second sealing layer 502 comprises a protruding portion 502-1 partially occupying the top portions of the spaces 407, 408, 409, 410, 411, 412. In some embodiments, the bottom end 502-2 of the second protruding portion 502-1 is lower than the top end 20-2 of the conductive elements 205, 206, 207, 208. In some embodiments, the bottom end 502-2 of the second protruding portion 502-1 is lower than the top end 30-2 of the supporting pillars 304, 305, 306. In some embodiments, the second protruding portion 502-1 is integrally formed with the second sealing layer 502 to prevent the second sealing layer 502 from peeling off from the supporting pillars 304, 305, 306 and the conductive elements 205, 206, 207, 208.

Figure 4:
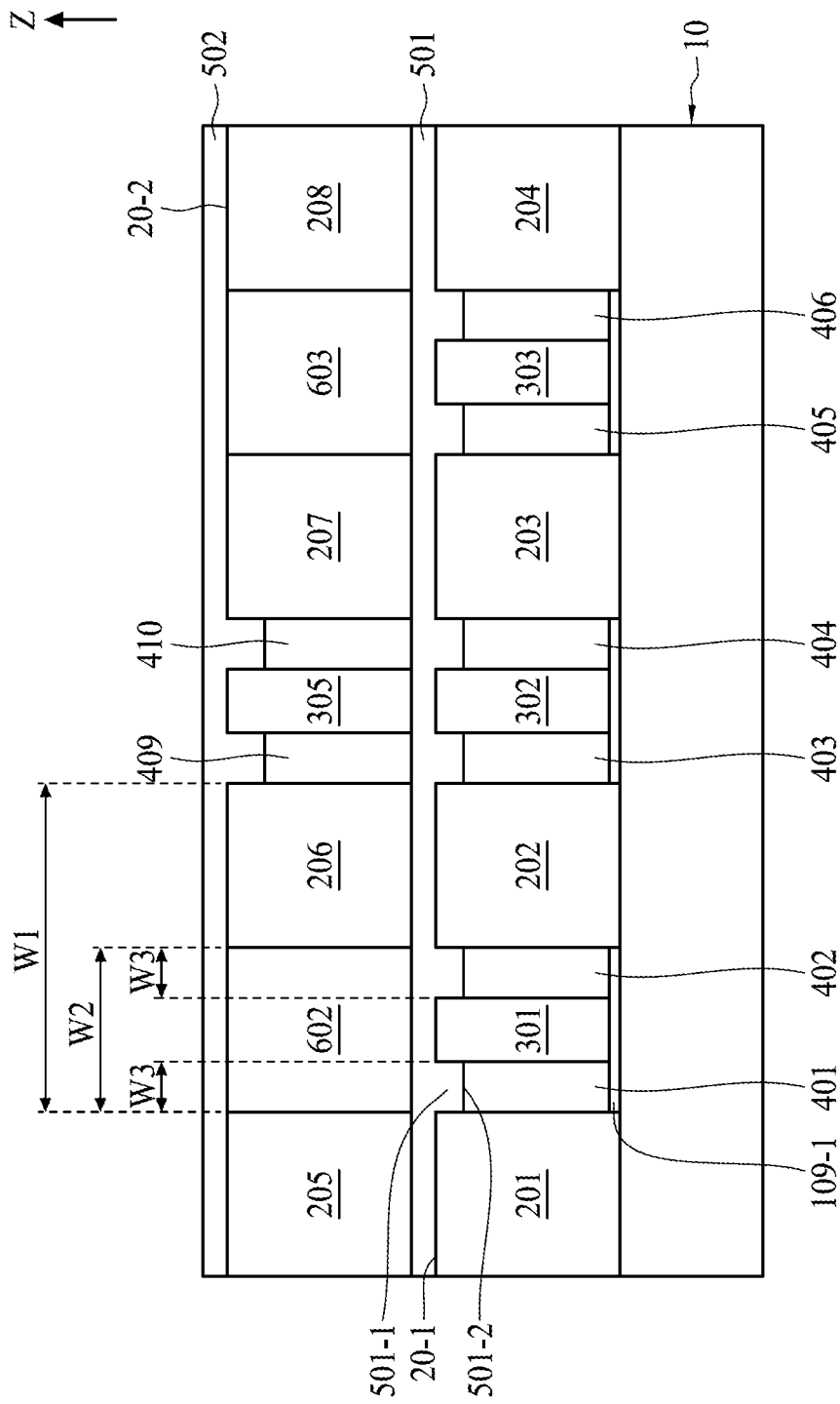

FIG. 4 illustrates, in a schematic cross-sectional diagram, a portion of a semiconductor device of another embodiment of the present disclosure.

With reference to FIG. 4, the semiconductor device includes a second insulating layer 602 and a third insulating layer 603. The second insulating layer 602 is disposed between the fifth conductive element 205 and the sixth conductive element 206. The second insulating layer 602 directly contacts a right sidewall of the fifth conductive element 205 and a left sidewall of the sixth conductive element 206. The third insulating layer 603 is disposed between the seventh conductive element 207 and the eighth conductive element 208. The third insulating layer 603 directly contacts a right sidewall of the seventh conductive element 207 and a left sidewall of the eighth conductive element 208.

The second insulating layer 602 and the third insulating layer 603 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. The second insulating layer 602 and the third insulating layer 603 may be formed of the same material but are not limited thereto. The presence of the second insulating layer 602 and the third insulating layer 603 may increase the mechanical strength of the semiconductor device.

Figure 5:
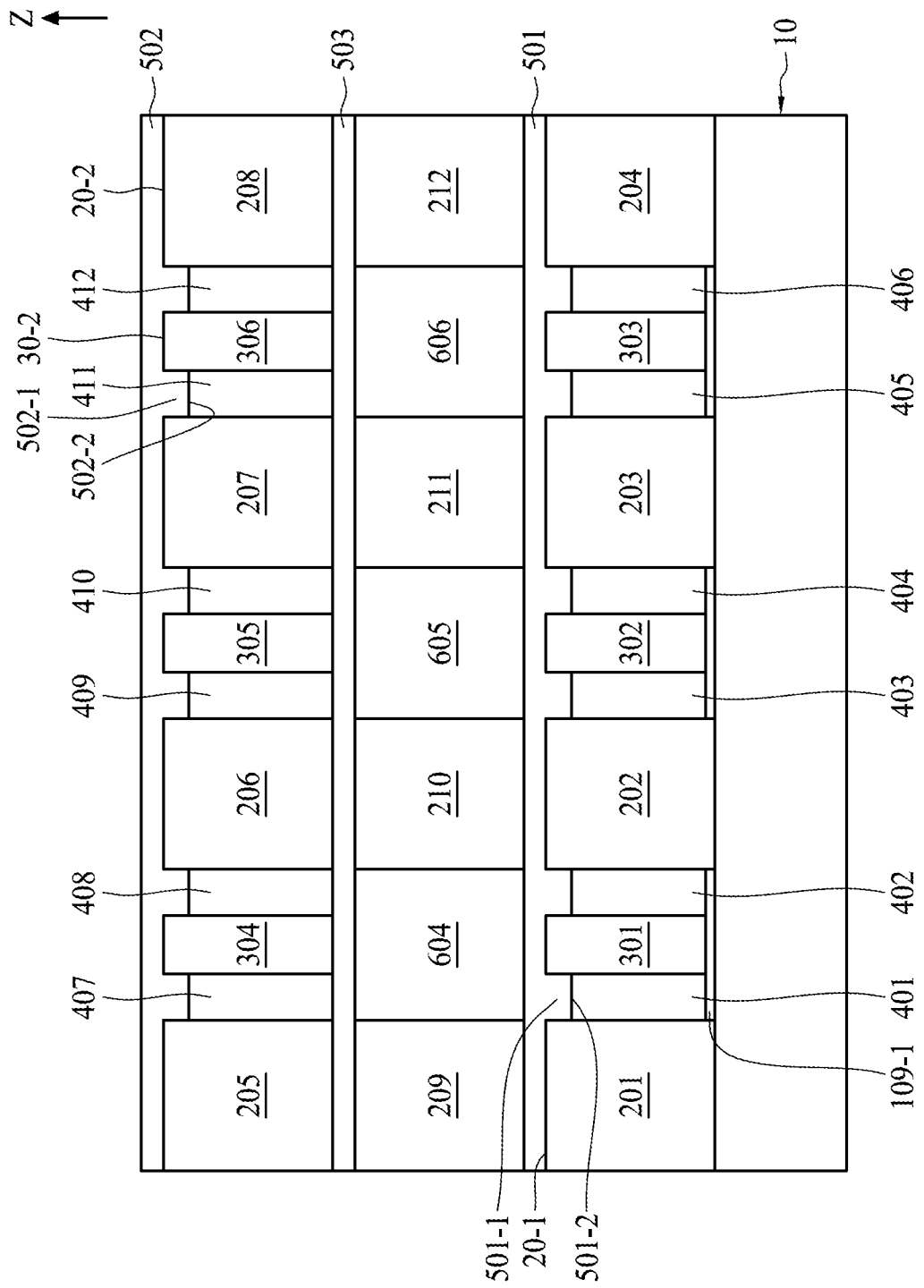

FIG. 5 illustrates, in a schematic cross-sectional diagram, a portion of a semiconductor device of another embodiment of the present disclosure.

With reference to FIG. 5, the semiconductor device includes a plurality of third set conductive elements, a fourth insulating layer 604, a fifth insulating layer 605, a sixth insulating layer 606, and third sealing layer 503. The plurality of third set conductive elements are disposed between the plurality of first set conductive elements 20 and the plurality of second set conductive elements. The plurality of third set conductive elements include a ninth conductive element 209, a tenth conductive element 210, an eleventh conductive element 211, and a twelfth conductive element 212.

With reference to FIG. 5, the ninth conductive element 209 is disposed on the first sealing layer 501. The tenth conductive element 210 is disposed on the first sealing layer 501 and is separated from the ninth conductive element 209. The eleventh conductive element 211 is opposite to the ninth conductive element 209 with the tenth conductive element 210 interposed therebetween. The twelfth conductive element 212 is opposite to the tenth conductive element 210 with the eleventh conductive element 211 interposed therebetween. The fourth insulating layer 604 is disposed between the ninth conductive element 209 and the tenth conductive element 210. The fourth insulating layer 604 directly contacts a right sidewall of the ninth conductive element 209 and a left sidewall of the tenth conductive element 210. The fifth insulating layer 605 is disposed between the tenth conductive element 210 and the eleventh conductive element 211. The fifth insulating layer 605 directly contacts a right sidewall of the tenth conductive element 210 and a left sidewall of the eleventh conductive element 211. The sixth insulating layer 606 is disposed between the eleventh conductive element 211 and the twelfth conductive element 212. The sixth insulating layer 606 directly contacts a right sidewall of the eleventh conductive element 211 and a left sidewall of the twelfth conductive element 212. The third sealing layer 503 is disposed above the plurality of third set conductive elements, the fourth insulating layer 604, the fifth insulating layer 605, and the sixth insulating layer 606. The third sealing layer 503 is disposed below the plurality of second set conductive elements, the fourth supporting pillar 304, the fifth supporting pillar 305, and the sixth supporting pillar 306.

The fourth insulating layer 604, the fifth insulating layer 605, and the sixth insulating layer 606 may be formed of the same material as that used to form the first insulating layer 601, but are not limited thereto. The ninth conductive element 209, the tenth conductive element 210, the eleventh conductive element 211, and the twelfth conductive element 212 may be formed of the same material as that used to form the first conductive element 201 but are not limited thereto. The third sealing layer 503 may be formed of the same material as that used to form the first sealing layer 501, but is not limited thereto.

Figure 6:
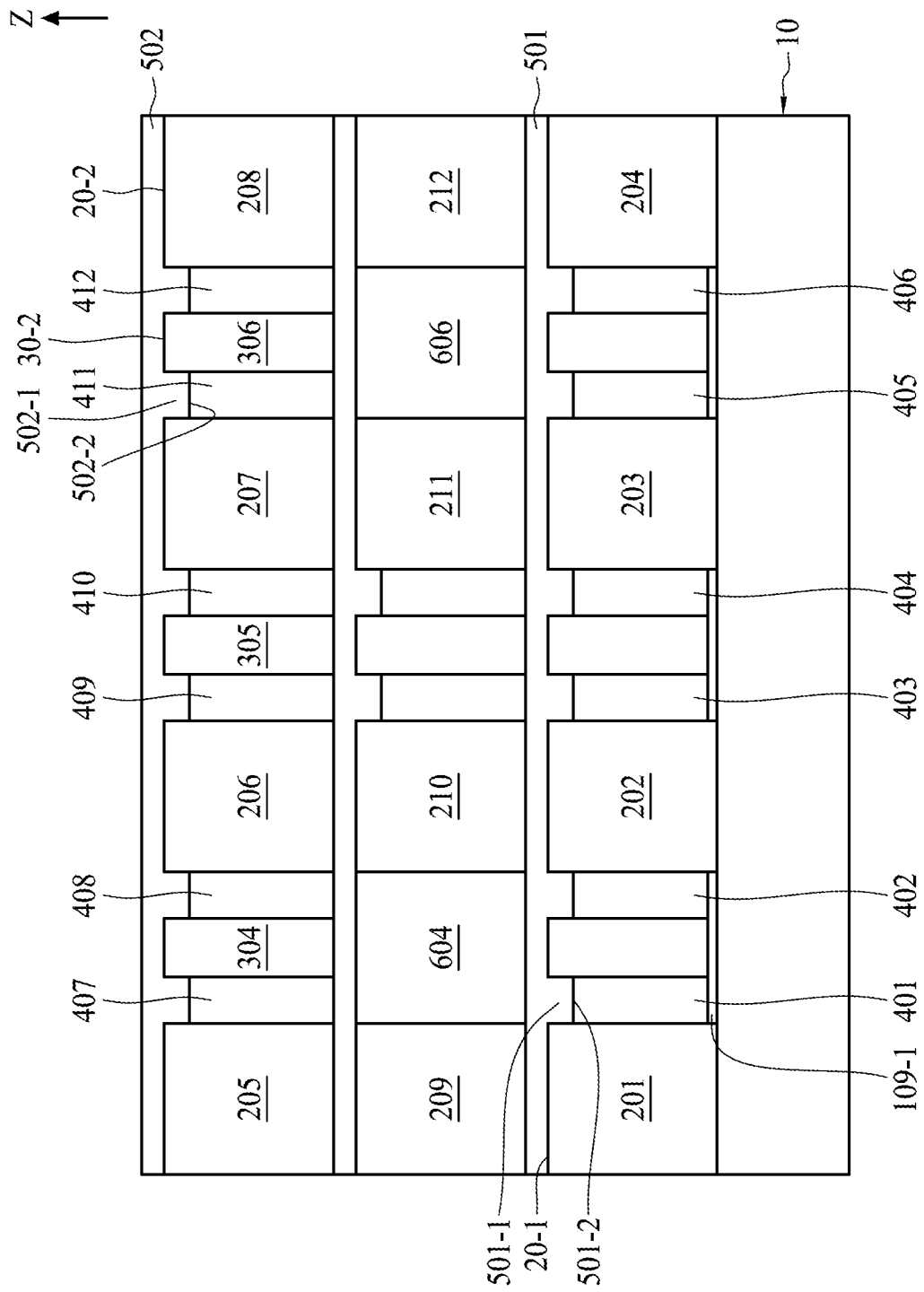

FIG. 6 illustrates, in a schematic cross-sectional diagram, a portion of a semiconductor device of another embodiment of the present disclosure.

With reference to FIG. 6, the semiconductor device includes a seventh supporting pillar 307, and the plurality of spaces 40 further include a thirteenth space 413 and a fourteenth space 414. The seventh supporting pillar 307 is disposed between the tenth conductive element 210 and the eleventh conductive element 211. The thirteenth space 413 is disposed between the tenth conductive element 210 and the seventh supporting pillar 307. The fourteenth space 414 is disposed between the seventh supporting pillar 307 and the eleventh conductive element 211. The seventh supporting pillar 307 may be formed of the same material as that used to form the first supporting pillar 301, but is not limited thereto.

Figure 7:
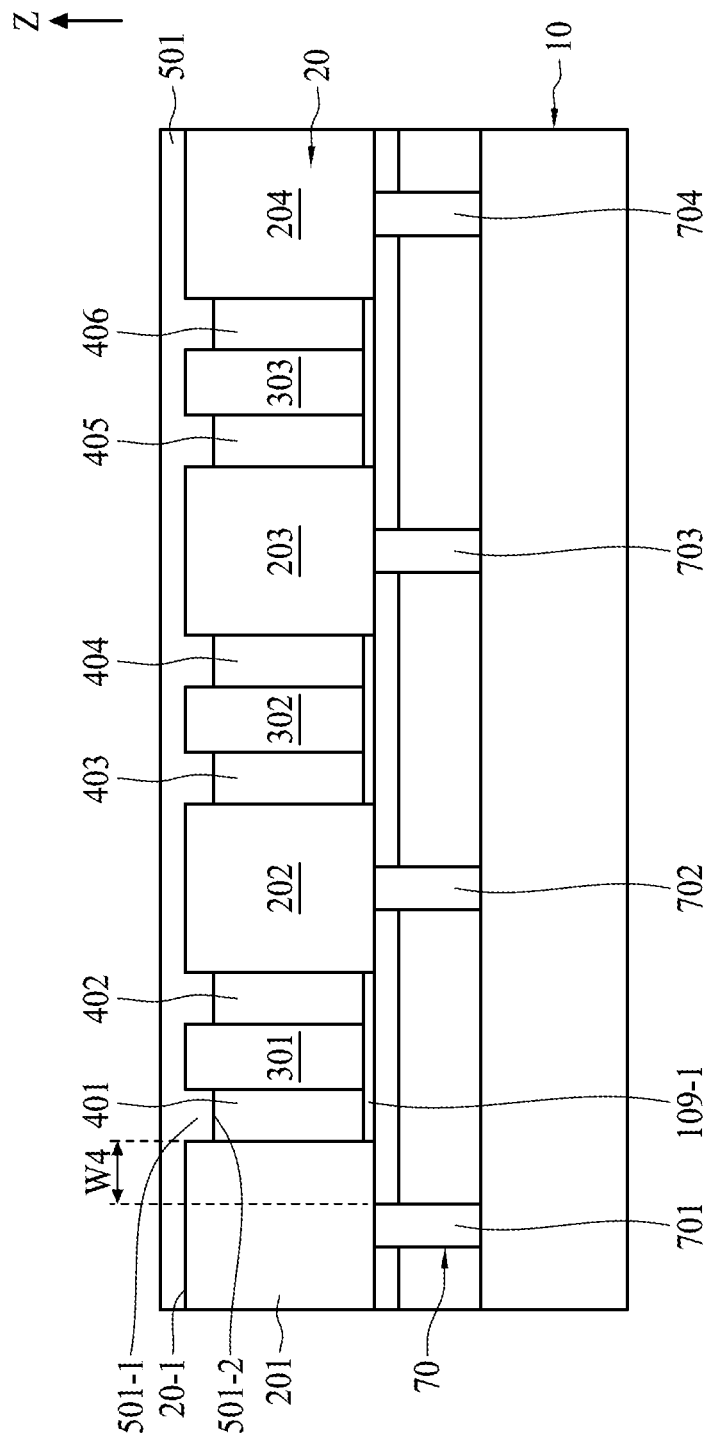

FIG. 7 illustrates, in a schematic cross-sectional diagram, a portion of a semiconductor device of another embodiment of the present disclosure.

With reference to FIG. 7, the semiconductor device includes a plurality of first conductive vias 70. The plurality of first conductive vias 70 are disposed between the plurality of first set conductive elements 20 and the semiconductor substrate 10. The plurality of first conductive vias 70 may electrically connect to the plurality of first set conductive elements 20. In the embodiment depicted, the plurality of first conductive vias 70 include a first via 701, a second via 702, a third via 703, and a fourth via 704. The first via 701 is electrically and physically connected to the first conductive element 201. The second via 702 is electrically and physically connected to the second conductive element 202. The third via 703 is electrically and physically connected to the third conductive element 203. The fourth via 704 is electrically and physically connected to the fourth conductive element 204. A horizontal distance W4 between the first via 701 and the first space 401 is less than about 50 nm. Preferably, the horizontal distance W4 between the first via 701 and the first space 401 is about 10 nm to about 50 nm. The plurality of first conductive vias 70 may be formed of, for example, metal, metal alloy, silicate, silicide, polysilicon, amorphous silicon, or any other semiconductor-compatible conductive material. The plurality of first conductive vias 70 do not overlap the plurality of spaces 40 in order to increase the mechanical strength of the semiconductor device.

Figure 8:
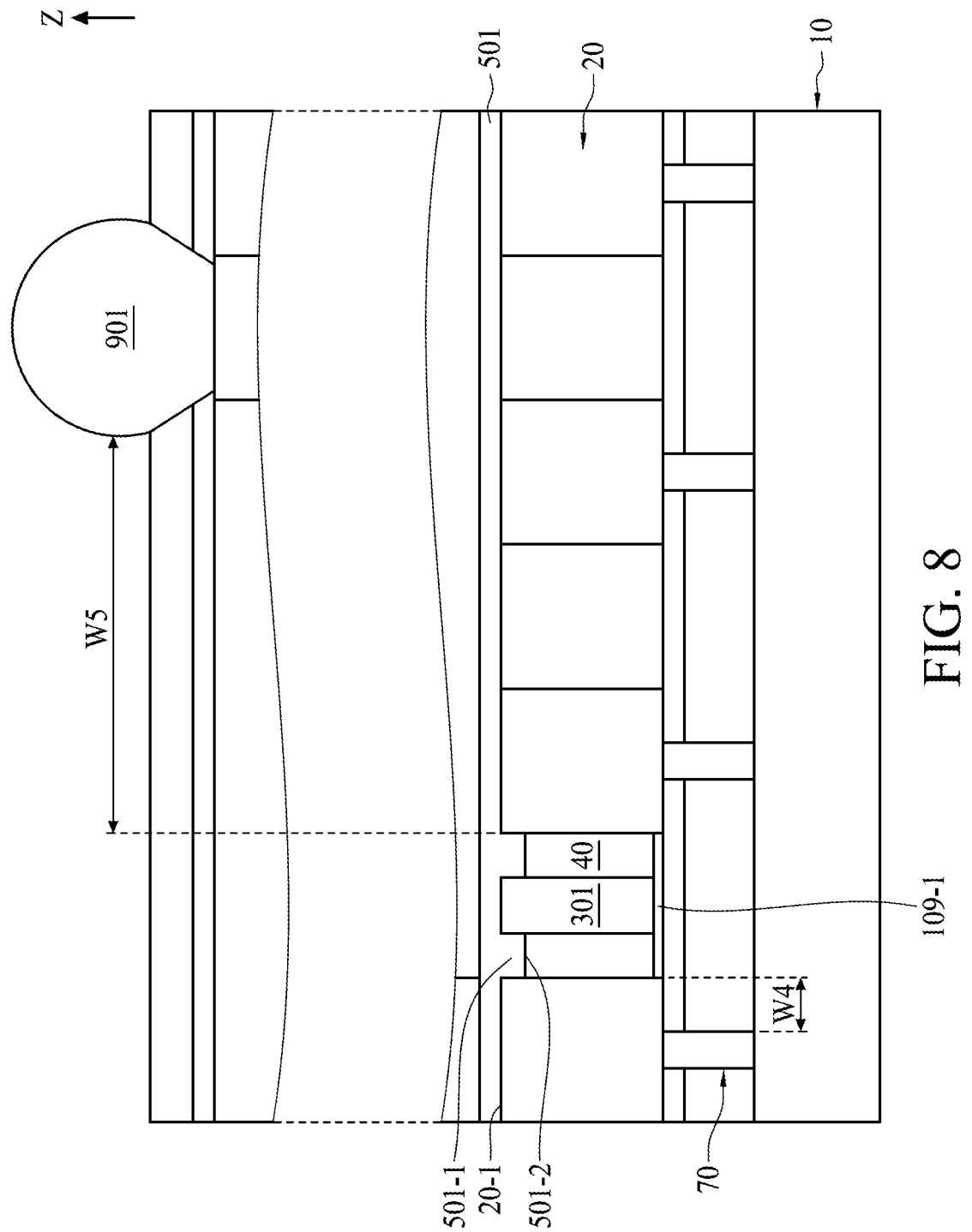

FIG. 8 illustrates, in a schematic cross-sectional diagram, a portion of a semiconductor device of another embodiment of the present disclosure.

With reference to FIG. 8, the semiconductor device includes a plurality of solder units 901. (Only one solder unit is shown in FIG. 8 for simplicity.) The plurality of solder units 901 are disposed above the plurality of first set conductive elements 20 and are electrically coupled to the plurality of first set conductive elements 20. A horizontal distance W5 between one of the plurality of solder units 901 and an adjacent one of the plurality of spaces 40 is less than 50 nm. Preferably, the horizontal distance W5 between the one of the plurality of solder units 901 and the adjacent one of the plurality of spaces 40 is about 25 nm to 50 nm.

Figure 9:
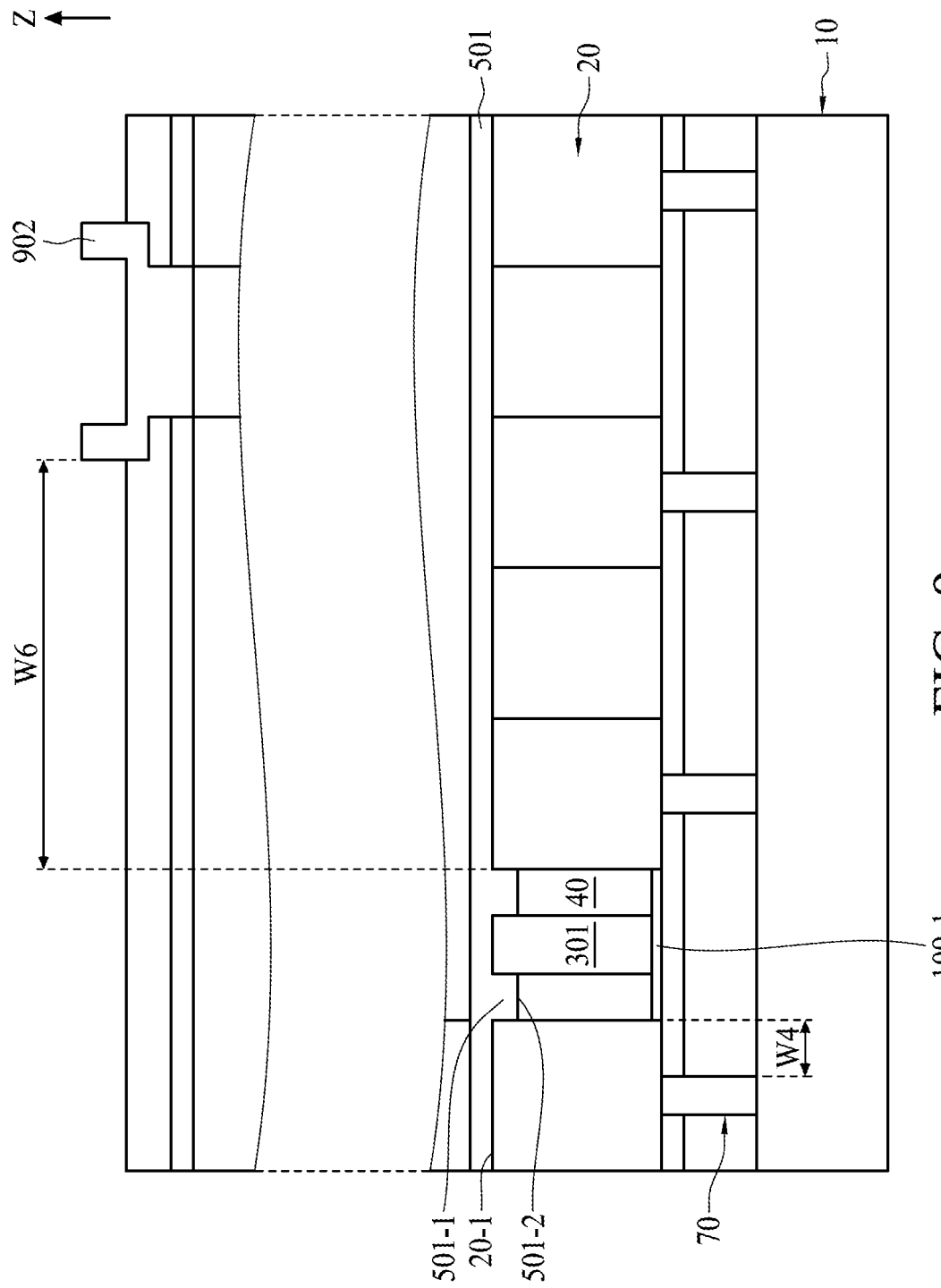

FIG. 9 illustrates, in a schematic cross-sectional diagram, a portion of a semiconductor device of another embodiment of the present disclosure.

With reference to FIG. 9, the semiconductor device includes a plurality of pad units 902. (Only one pad unit is shown in FIG. 9 for simplicity.) The plurality of pad units 902 are disposed above the plurality of first set conductive elements 20 and are electrically coupled to the plurality of first set conductive elements 20. A horizontal distance W6 between one of the plurality of pad units 902 and an adjacent one of the plurality of spaces 40 is less than 50 nm. Preferably, the horizontal distance W6 between the one of the plurality of pad units 902 and the adjacent one of the plurality of spaces 40 is about 25 nm to 50 nm.

During a packaging process, heat and stress are often applied to the semiconductor device. Because the plurality of solder units 901 and the plurality of pad units 902 do not overlap with any of the plurality of spaces, the mechanical strength of the semiconductor device may be improved, and the semiconductor device may be protected from the stress and heat during the packaging process.

Figure 10:
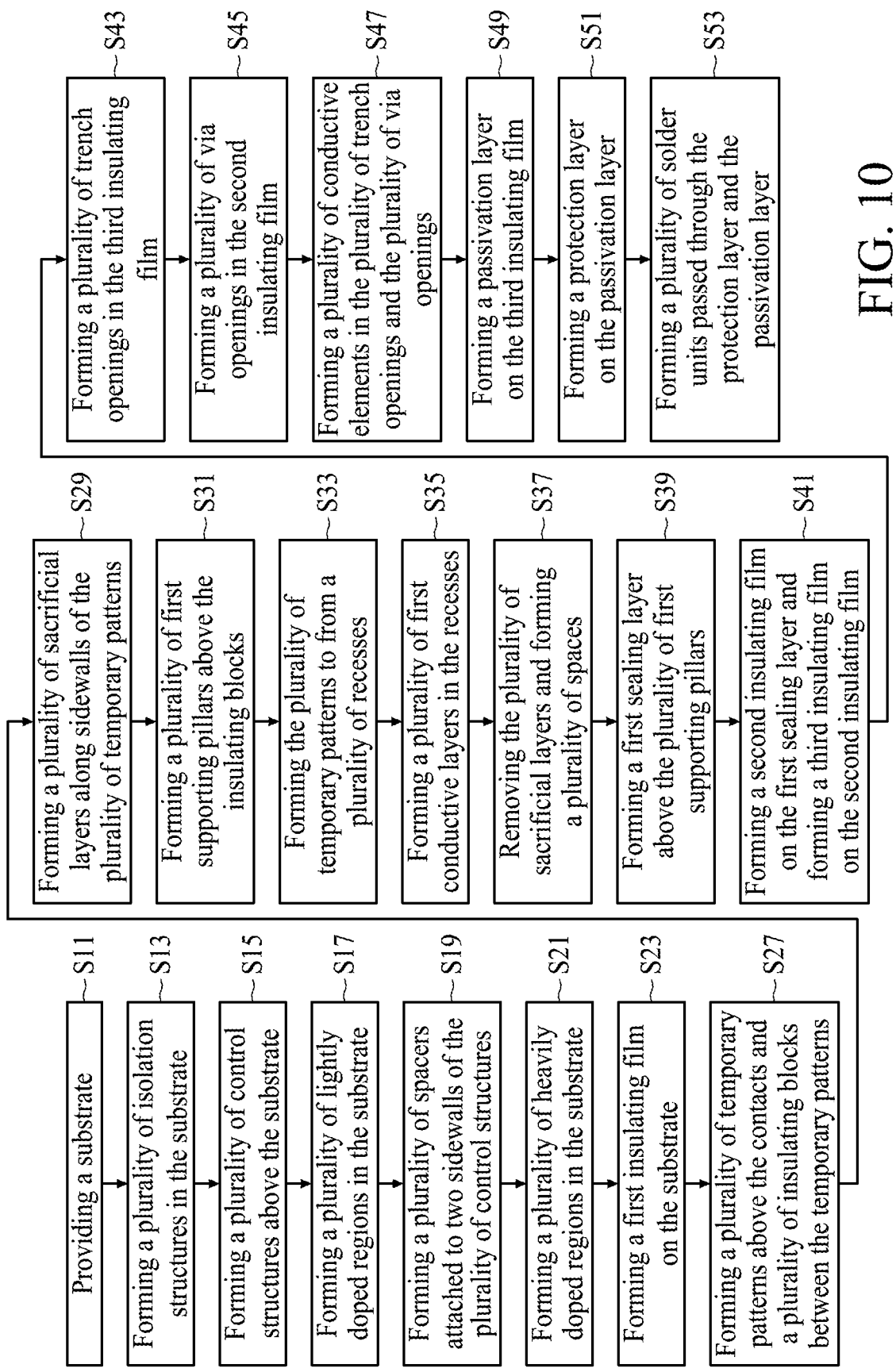
FIG. 10 illustrates, in flowchart diagram form, a method for fabricating a semiconductor device in accordance with one embodiment of the present disclosure.

FIG. 10 illustrates, in flowchart diagram form, a method for fabricating a semiconductor device in accordance with one embodiment of the present disclosure. FIGS. 11 to 30 illustrate, in schematic cross-sectional diagrams, a flow of fabricating a semiconductor device in accordance with one embodiment of the present disclosure.

Figure 11:
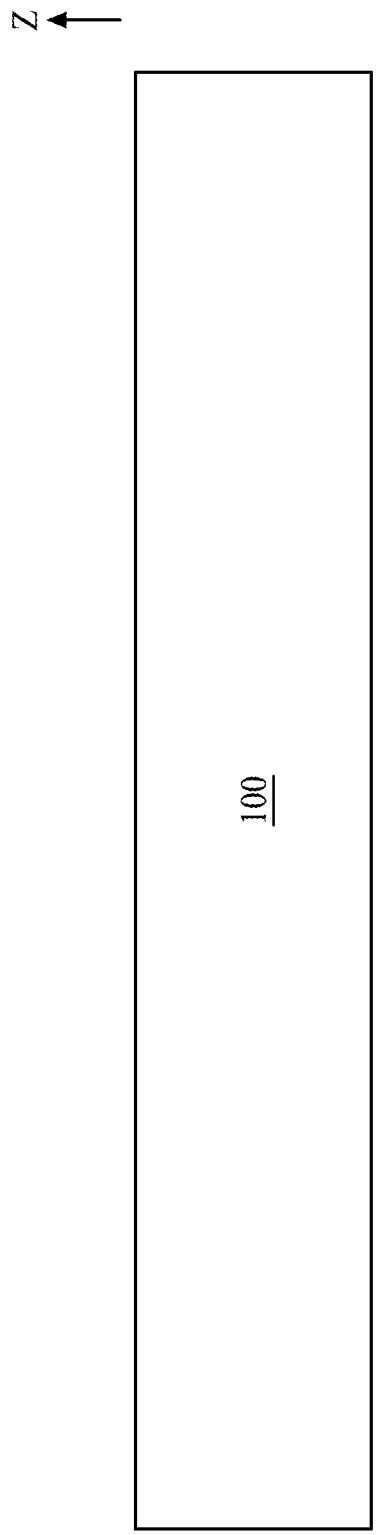
FIGS. 11 to 32 illustrate, in schematic cross-sectional diagrams, a flow of fabricating a semiconductor device in accordance with one embodiment of the present disclosure.

With reference to FIG. 10 and FIG. 11, at step S11, a substrate 100 is provided. The substrate 100 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or II-VI semiconductor material.

Figure 12:
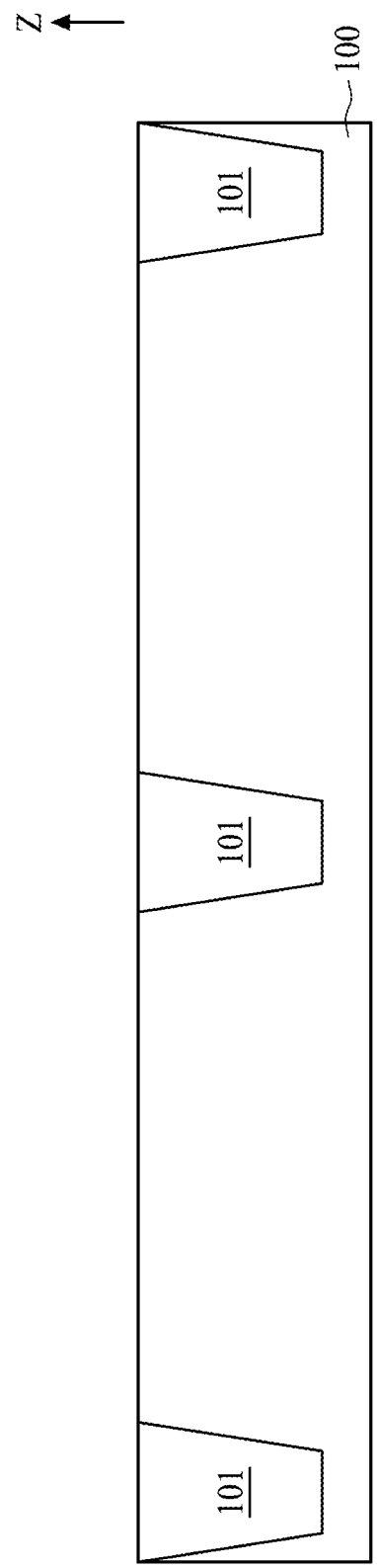

With reference to FIG. 10 and FIG. 12, at step S13, a plurality of isolation structures 101 are formed in the substrate 100. The plurality of isolation structures 101 are separated from each other. The plurality of isolation structures 101 are formed of, for example, an insulating material such as silicon oxide, silicon nitride, silicon oxynitride, silicon nitride oxide, fluoride-doped silicate, or the like.

Figure 13:
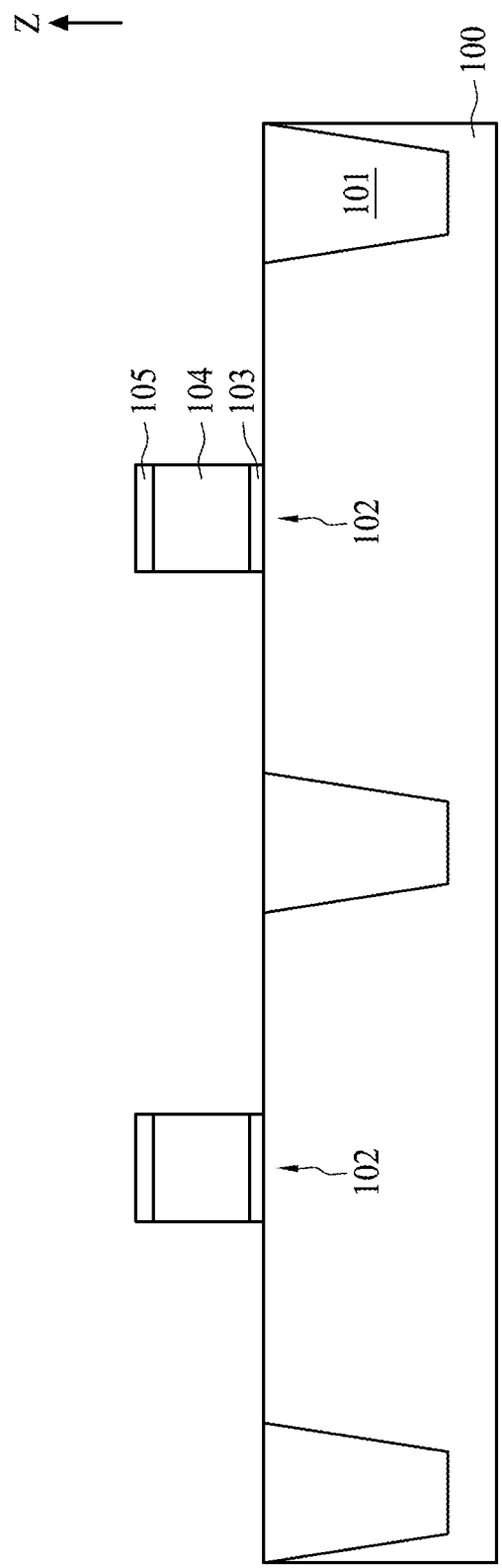

With reference to FIG. 10 and FIG. 13, at step S15, a plurality of control structures 102 are formed on the substrate 100. The plurality of control structures 102 are formed above the substrate 100. In the embodiment depicted, each one of the plurality of control structures 102 includes a bottom insulating layer 103, a middle layer 104, and a top layer 105. The bottom insulating layer 103 is disposed on the substrate 100 and has two edges. The middle layer 104 is disposed on the bottom insulating layer 103. The top layer 105 is disposed on the middle layer 104.

The bottom insulating layer 103 is formed of, for example, silicon oxide, silicon oxynitride, silicon nitride oxide, silicon nitride, or the like. The middle layer 104 is formed of, for example, polysilicon. The top layer 105 is formed of, for example, metal silicide such as nickel silicide, platinum silicide, titanium silicide, molybdenum silicide, cobalt silicide, tantalum silicide, tungsten silicide, or the like.

Figure 14:
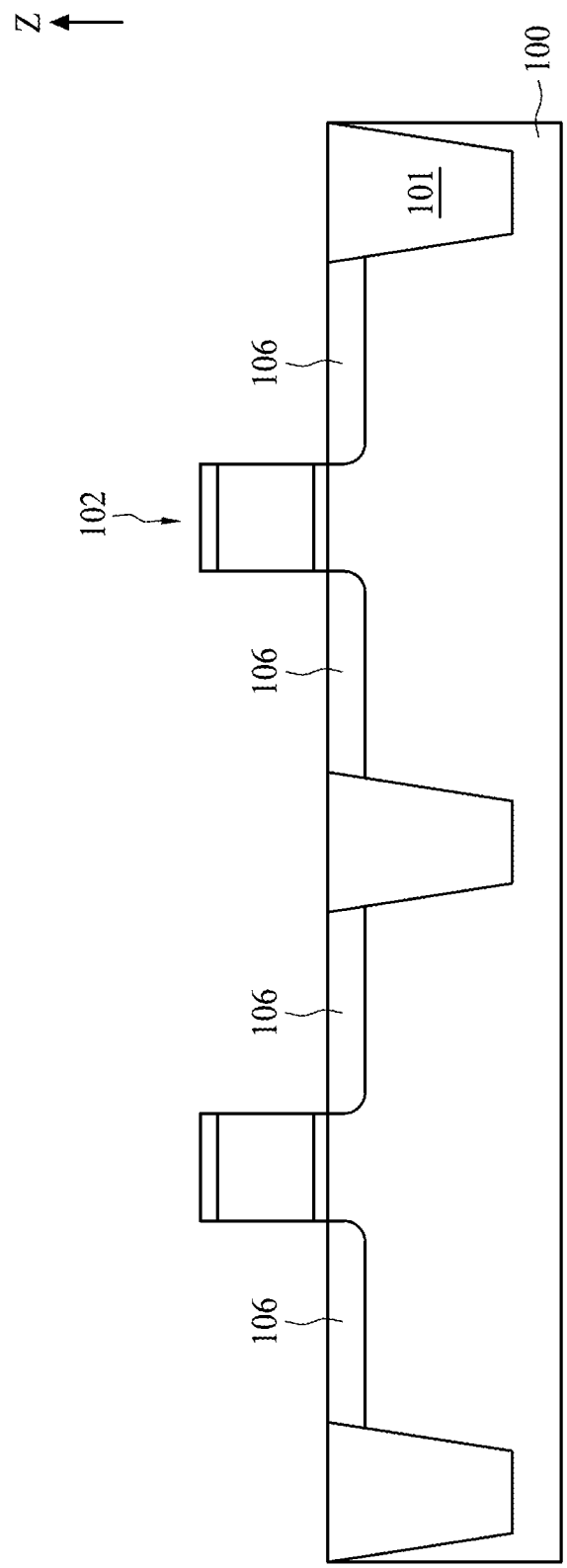

With reference to FIG. 10 and FIG. 14, at step S17, a plurality of lightly doped regions 106 are formed in the substrate 100. The plurality of lightly doped regions 106 respectively abut the two edges of the bottom insulating layer 103. Each one of the plurality of lightly doped regions 106 has a dopant concentration ranging from about 1E14 atoms/cm$^3$ to about 1E16 atoms/cm$^3$.

Figure 15:
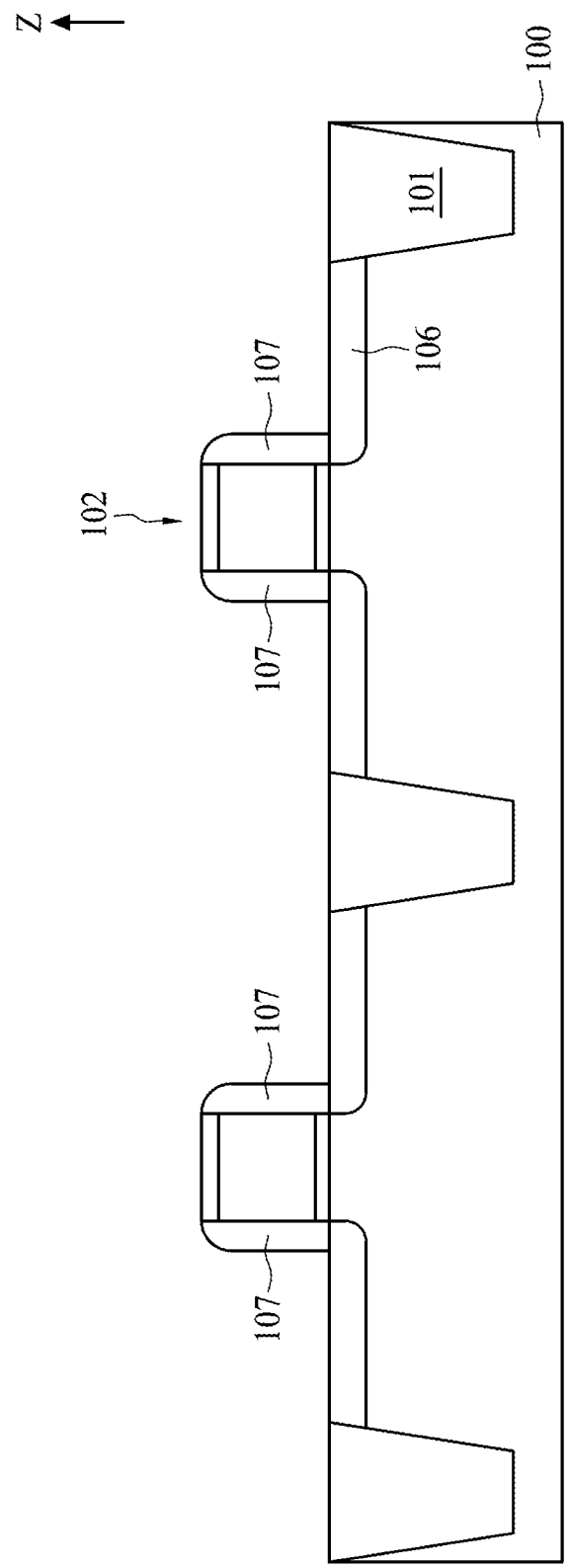

With reference to FIG. 10 and FIG. 15, at step S19, a plurality of spacers 107 are formed above the substrate 100. The plurality of spacers 107 are respectively correspondingly attached to two sidewalls of the plurality of control structures 102. The plurality of spacers 107 may be formed of, for example, silicon oxide, silicon nitride, or the like.

Figure 16:
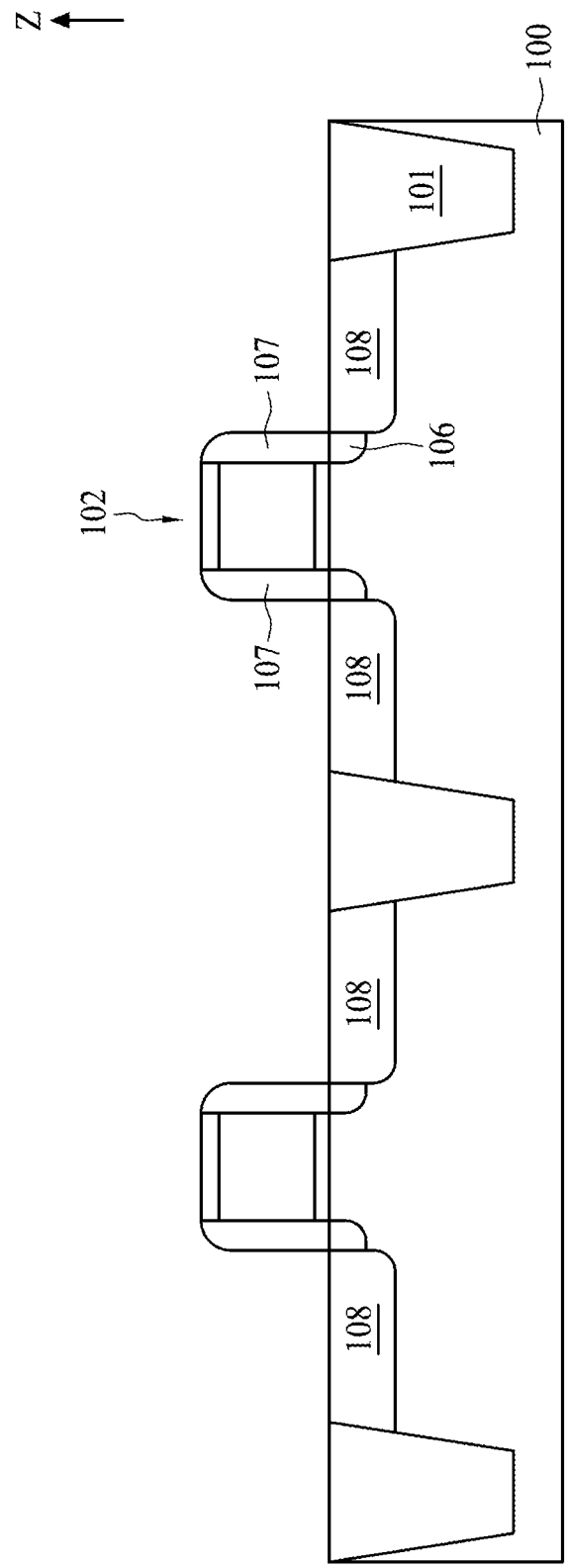

With reference to FIG. 10 and FIG. 16, at step S21, a plurality of heavily doped regions 108 are formed in the substrate 100. The plurality of heavily doped regions 108 respectively correspondingly abut the plurality of spacers 107. Each one of the plurality of heavily doped regions 108 has a dopant concentration ranging from about 1E17 atoms/cm$^3$ to about 1E19 atoms/cm$^3$. The plurality of control structures 102, the plurality of lightly doped regions 106, the plurality of spacers 107, and the plurality of heavily doped regions 108 together form a plurality of semiconductor elements.

Figure 17:
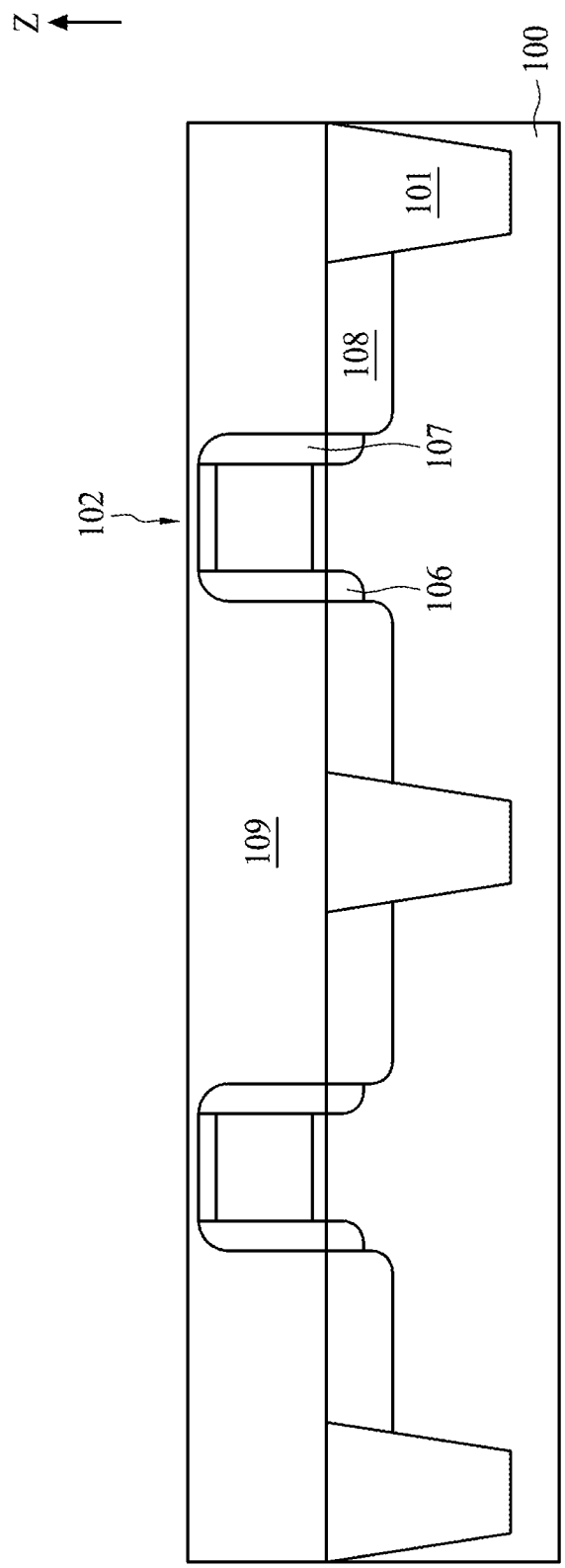

With reference to FIG. 10 and FIG. 17, at step S23, a first insulating film 109 is formed on the substrate 100. The first insulating film 109 encloses the plurality of control structures 102 and the plurality of spacers 107. The first insulating film 109 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto.

Figure 18:
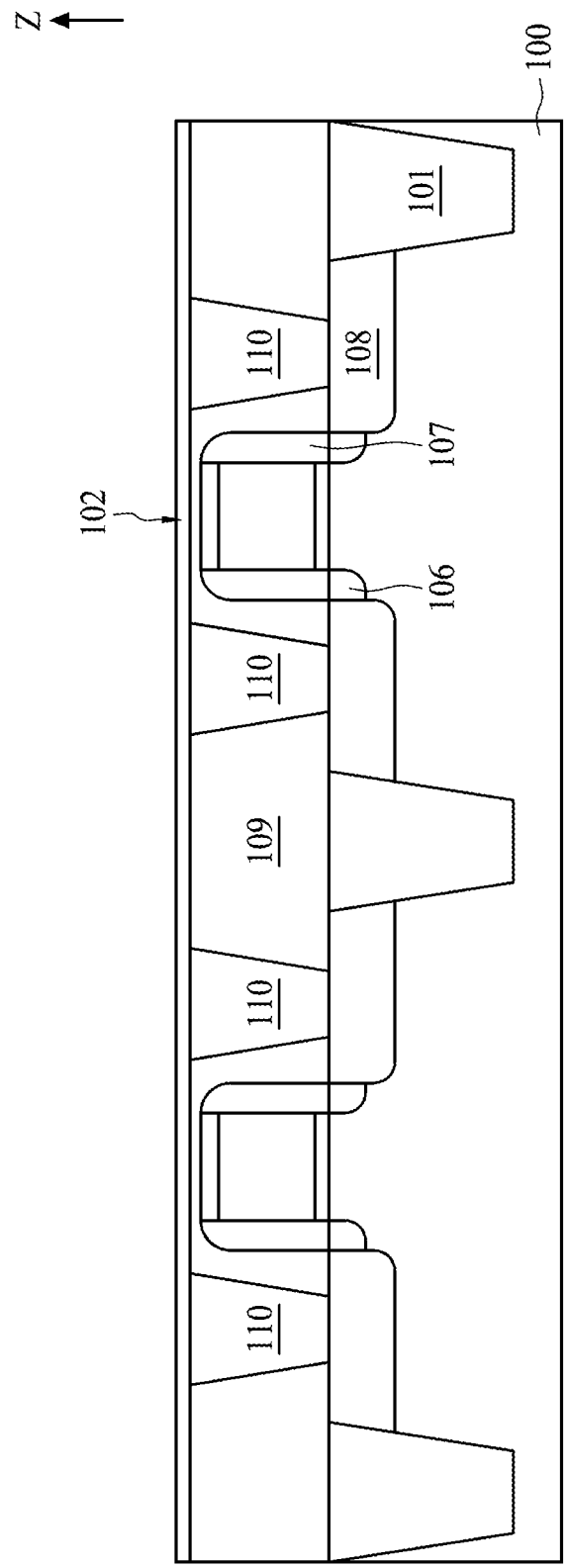

With reference to FIG. 10 and FIG. 18, at step S25, a plurality of contacts 110 are formed in the first insulating film 109. A photolithography process may be used to pattern the first insulating film 109 to define positions and sizes of the plurality of contacts 110. An etch process, such as an anisotropic dry etch process, may be performed after the photolithography process to form a plurality of contact openings in the first insulating film 109. After the etch process, a conductive material, for example, aluminum, copper, tungsten, cobalt, or other suitable metal or metal alloy is filled, by a metallization process such as chemical vapor deposition, physical vapor deposition, sputtering, or the like, in the plurality of contact openings to form the plurality of contacts 110. A planarization process, such as chemical mechanical polishing, may be performed after the metallization process to remove excess filling material and provide a substantially flat surface for subsequent processing steps.

Figure 19:
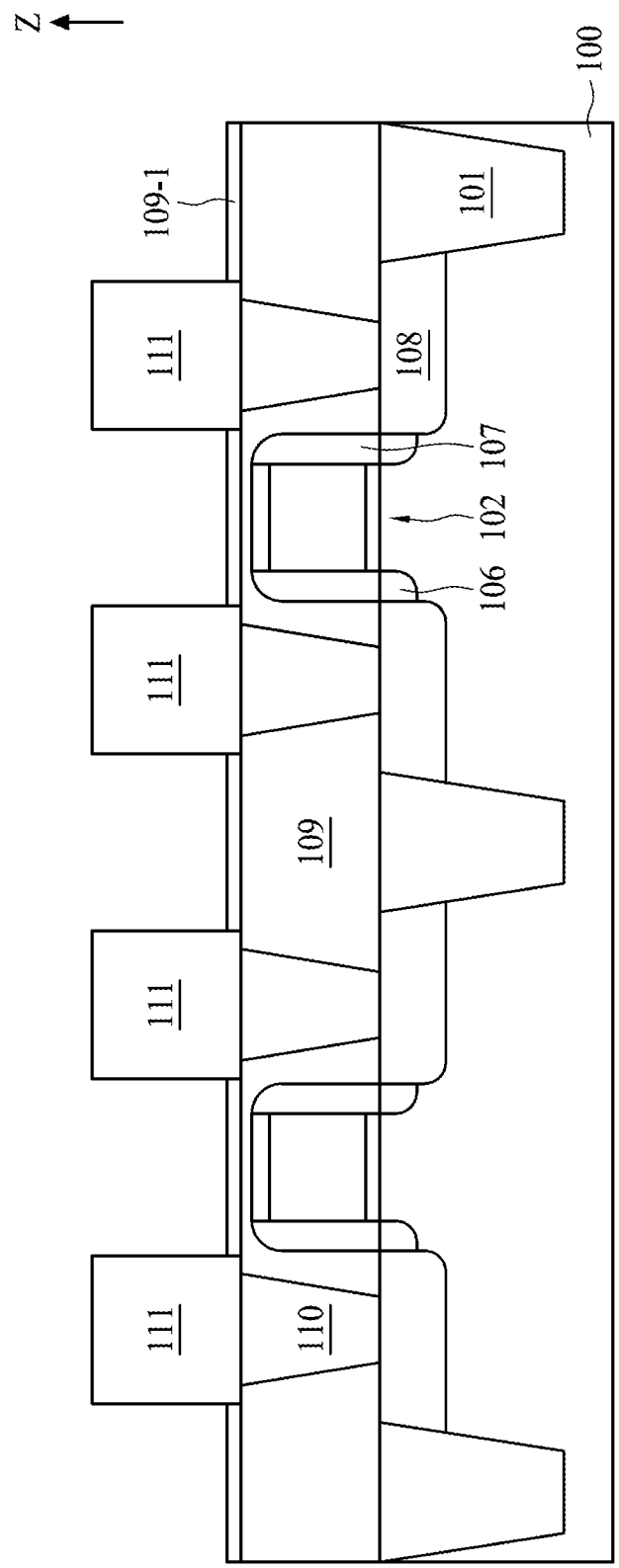

With reference to FIG. 10 and FIG. 19, at step S27, a plurality of temporary patterns 111 are formed above the plurality of contacts 110, respectively; in addition, a plurality of insulating blocks 109-1 are formed between the temporary patterns 111. In some embodiments, the plurality of temporary patterns 111 are made of non-conductive material such as carbon-containing material. In some embodiments, the plurality of insulating blocks 109-1 are made of undoped oxide. In some embodiments, the height of the plurality of insulating blocks 109-1 is less than that of the temporary patterns 111.

Figure 20:
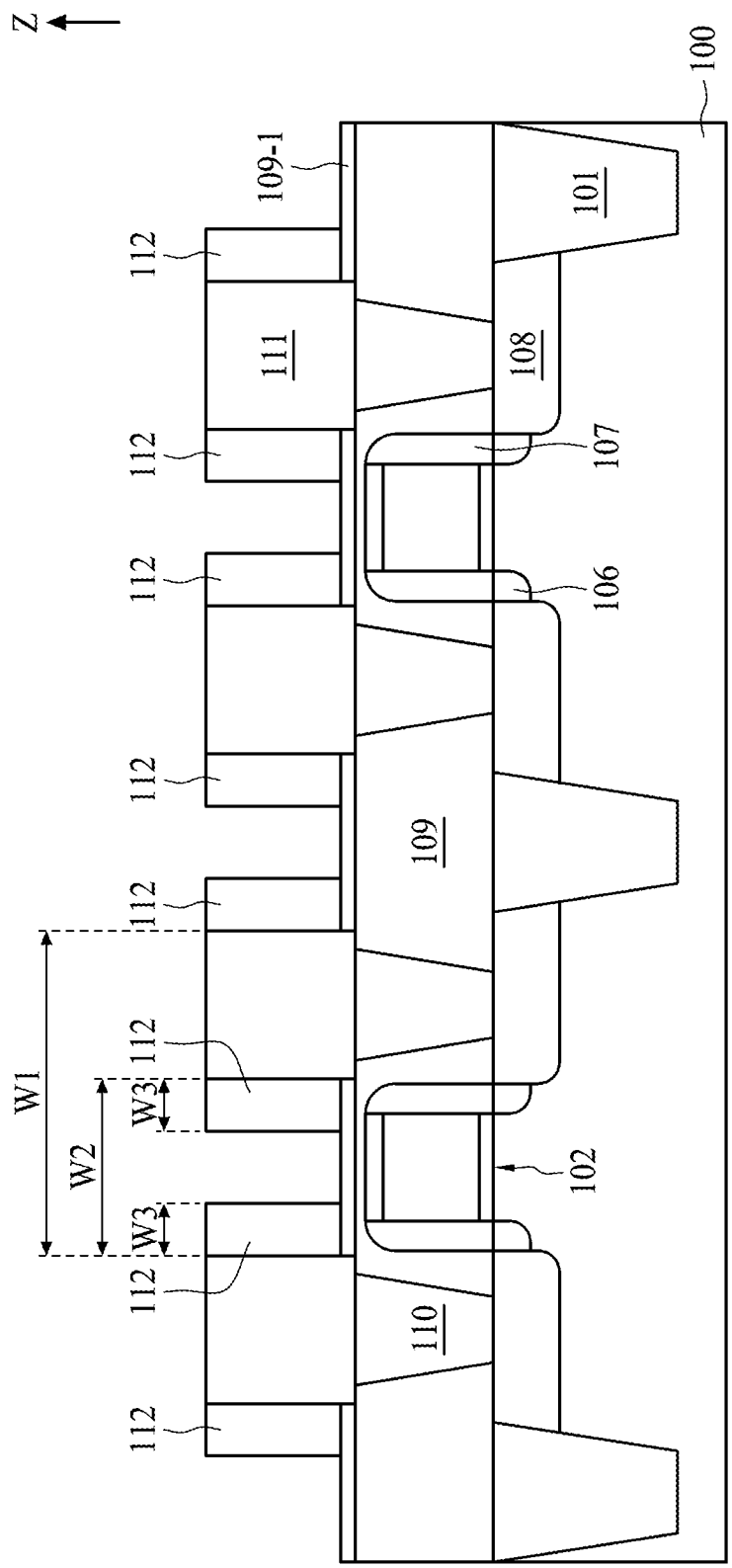

With reference to FIG. 10 and FIG. 20, at step 29, a plurality of sacrificial layers 112 are formed along sidewalls of the plurality of temporary patterns 111 and over the insulating blocks 109-1. In the embodiment depicted, the plurality of sacrificial layers 112 may be formed of, for example, a doped oxide such as borosilica glass, phosphosilica glass, borophosphosilica glass, fluoride silicate glass, carbon doped silicon oxide, or the like. In the embodiment depicted, the first insulating film 109 may be formed of, for example, undoped oxide like the insulating blocks 109-1. In some embodiments, the plurality of sacrificial layers 112 formed of doped oxide may exhibit a faster etching rate when etched by vapor hydrogen fluoride as compared to layers formed of undoped oxide. This may be due to the lower density characteristic of the undoped oxide. Alternatively, in another embodiment depicted, the plurality of sacrificial layers 112 may be formed of, for example, a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer.

With reference to FIG. 10 and FIG. 20, a width W3 of one of the plurality of sacrificial layers 112 is less than or equal to one-fourth of a horizontal distance W2 between adjacent pairs of the plurality of temporary patterns 111. The horizontal distance W2 between adjacent pairs of the plurality of temporary patterns 111 is less than or equal to one-half of a horizontal distance W1 from a right sidewall of one of the plurality of temporary patterns 111 to a right sidewall of an adjacent one of the plurality of temporary patterns 111.

With reference to FIG. 10 and FIG. 20, in the embodiment depicted, a deposition process may be used to form a precursor layer of the plurality of sacrificial layers 112. An etch process, such as an anisotropic dry etch process, may be performed after the deposition process to form the plurality of sacrificial layers 112. Alternatively, in another embodiment depicted, a selective deposition process may be used to selectively and directly form the plurality of sacrificial layers 112 along the sidewalls of the plurality of temporary patterns 111.

In some embodiments, the sacrificial layers 112 can be formed (e.g., deposited) using a number of methods, such as: chemical vapor deposition using O$_3$ and TEAS to form silicon oxide, atomic layer deposition using a silicon precursor with an oxygen or nitrogen precursor to form silicon oxides and nitrides. The sacrificial layers 112 can be formed using a method such as a reactive ion etch (ME) process selectively stopping at a dielectric anti-reflective coating (DARC) layer (not shown).

In some embodiments, the formation of the sacrificial layers 112 may include performing an ion implantation process using temporary patterns 111 as a mask to selectively forming damaged areas in the insulating blocks 109-1 (first insulating film 109) between the temporary patterns 111, and then selectively forming the sacrificial layers 112 on side surfaces of the temporary patterns 111. In contrast to the traditional ion implantation used for doping, the purpose of the ion implantation process in the present embodiment is to damage the exposed horizontal surfaces of the insulating blocks 109-1 (first insulating film 109) to form damaged areas so that the subsequent formation of the sacrificial layers 112 may exclude the damaged areas.

Figure 21:
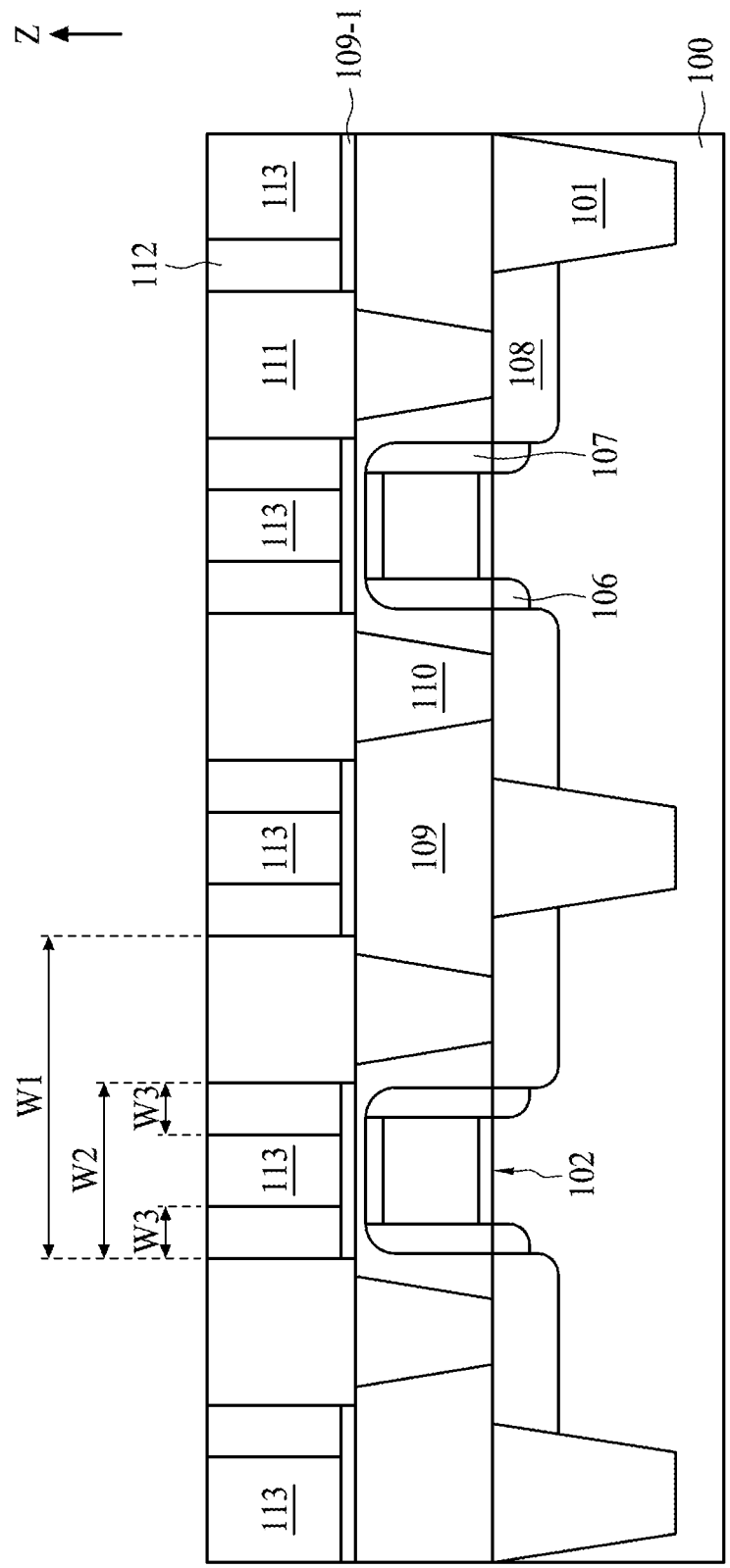

With reference to FIG. 10 and FIG. 21, at step 31, a plurality of supporting pillars 113 are formed above the insulating blocks 109-1. The plurality of supporting pillars 113 are respectively disposed between the plurality of sacrificial layers 112. The plurality of supporting pillars 113 may be formed of, for example, an undoped oxide such as silicon oxide or undoped silicon glass. Alternatively, in another embodiment depicted, the plurality of supporting pillars 113 may be formed of, for example, silicon nitride, silicon oxide, silicon oxynitride, silicon nitride oxide, flowable oxide, toner silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but are not limited thereto.

Figure 22:
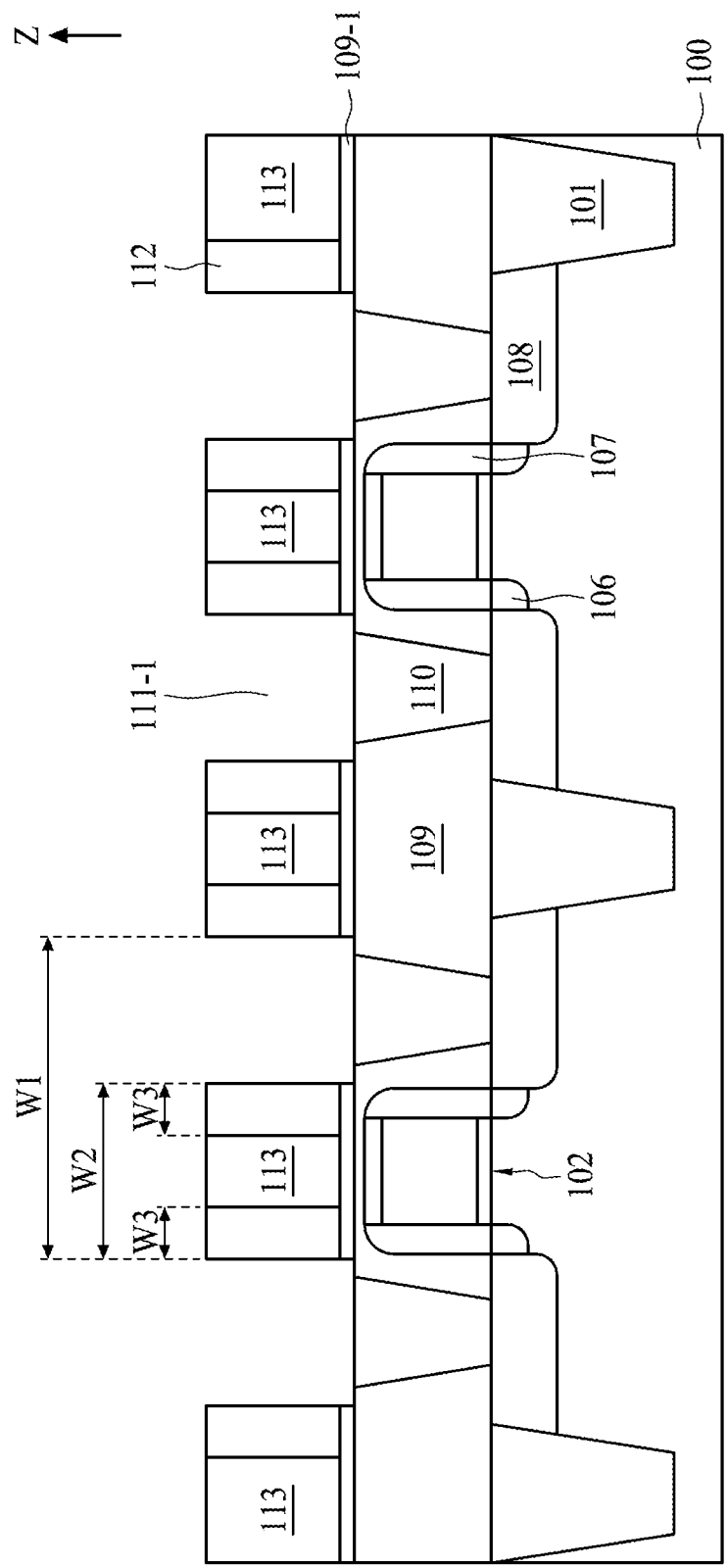

With reference to FIG. 10 and FIG. 22, at step 33, the plurality of temporary patterns 111 are removed to form a plurality of recesses 111-1 between the plurality of sacrificial layers 112. In some embodiments, the plurality of temporary patterns 111 are removed to expose the plurality of contacts 110.

Figure 23:
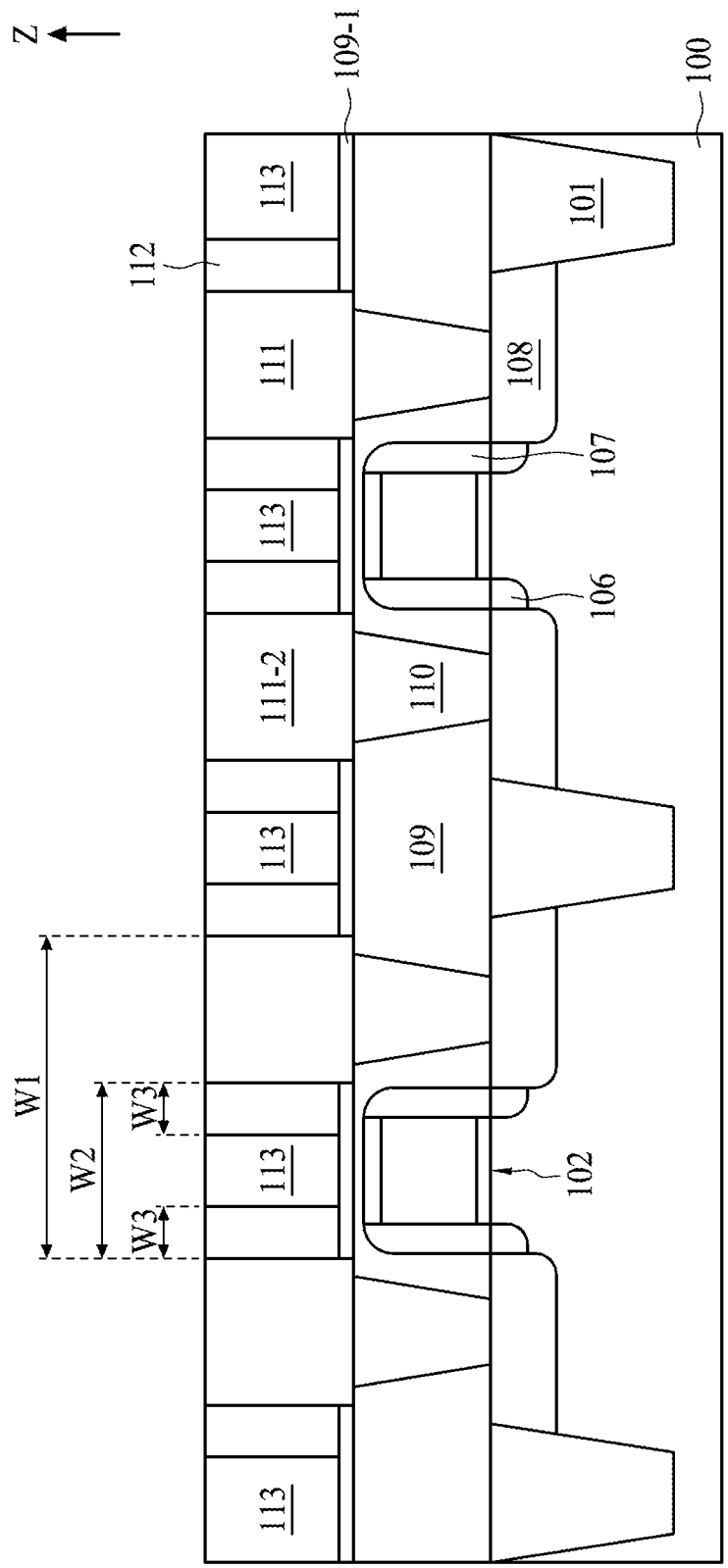

With reference to FIG. 10 and FIG. 23, at step 35, a plurality of first conductive layers 111-2 are formed between the plurality of sacrificial layers 112, i.e., filling the plurality of recesses 111-1. In some embodiments, the plurality of first conductive layers 111-2 are electrically coupled to the plurality of contacts 110. In some embodiments, the plurality of first conductive layers 111-2 may be formed of, for example, aluminum, copper, tungsten, cobalt, or other suitable metal or metal alloy.

Figure 24:
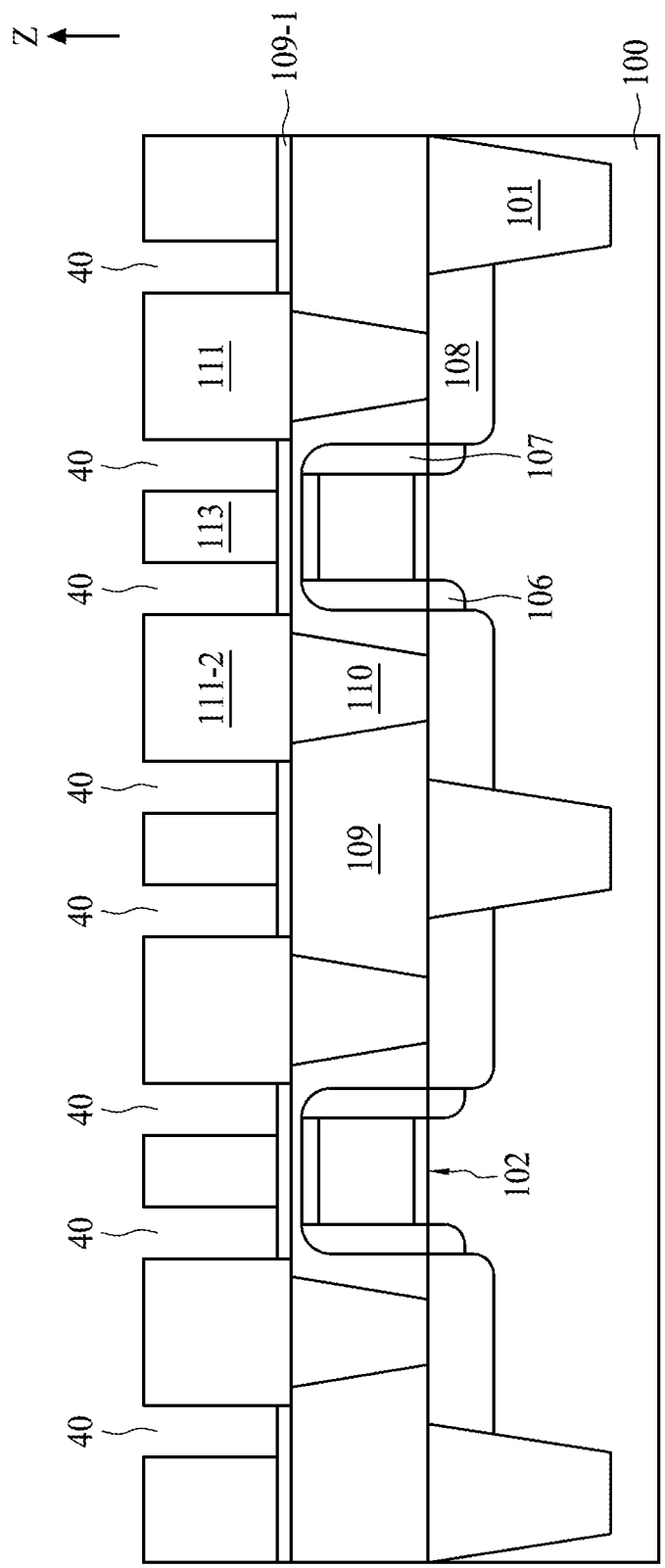

With reference to FIG. 10 and FIG. 24, at step 37, the plurality of sacrificial layers 112 are removed and a plurality of spaces 40 are formed in situ; in other words, the plurality of spaces 40 are formed in the places previously occupied by the plurality of sacrificial layers 112. In the embodiment depicted, a vapor hydrogen fluoride may be used to remove the plurality of sacrificial layers 112 to form the plurality of spaces 40. Due to the density difference between the plurality of sacrificial layers 112 formed of doped oxide and the plurality of supporting pillars 113 formed of undoped oxide (insulating blocks 109-1 formed of undoped oxide), the vapor hydrogen fluoride has a higher etching rate on the plurality of sacrificial layers 112 formed of doped oxide; therefore, the plurality of sacrificial layers 112 formed of doped oxide may be removed by the vapor hydrogen fluoride and the plurality of supporting pillars 113 formed of undoped oxide may be retained. The plurality of spaces 40 are respectively correspondingly disposed adjacent to the plurality of supporting pillars 113.

With reference to FIG. 10 and FIG. 24, alternatively, in another embodiment depicted, a heat process is applied to remove the plurality of sacrificial layers 112 formed of thermal decomposable polymer or thermal degradable polymer. A temperature of the heat process may be about 300° C. to about 450° C. In some embodiments, the temperature of the heat process may be about 350° C. to about 420° C.

Figure 25:
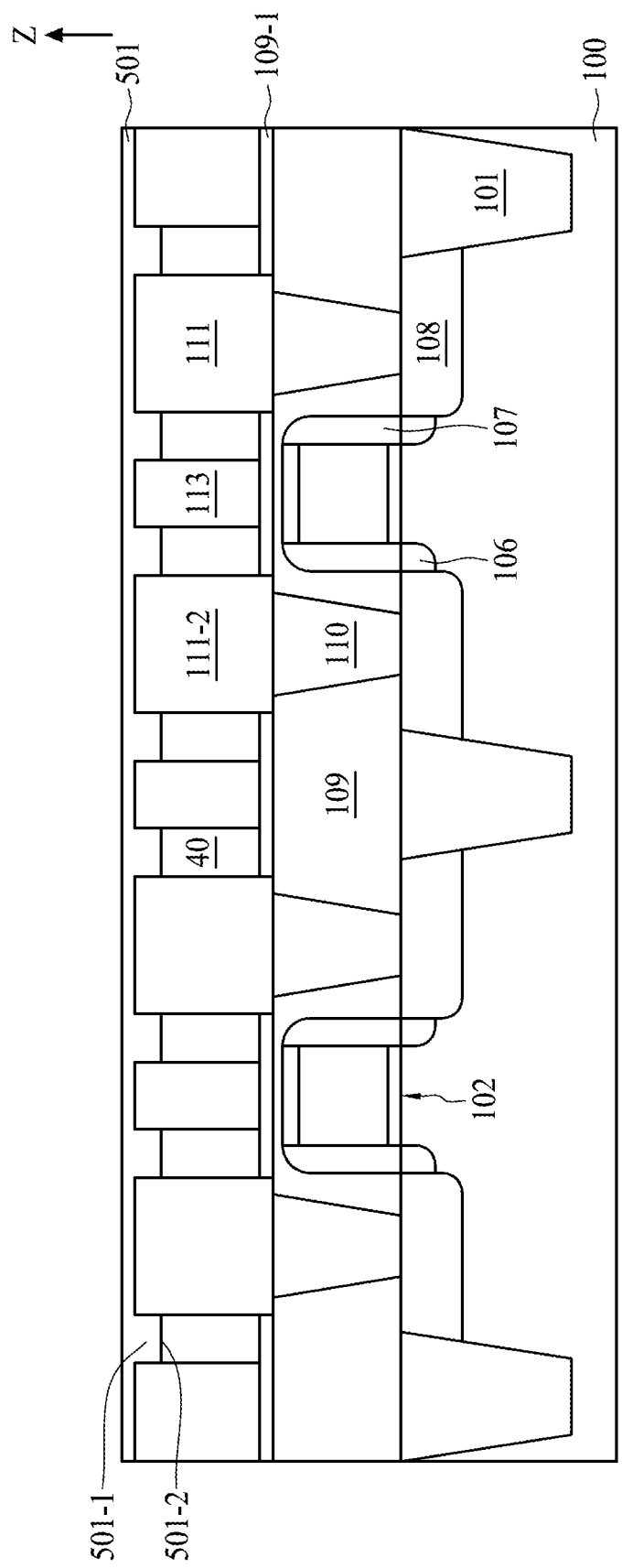

With reference to FIG. 10 and FIG. 25, at step 39, a first sealing layer 501 is formed on the plurality of supporting pillars 113 and the plurality of first conductive layers 111-2. The first sealing layer 501 may seal the plurality of spaces 40. The first sealing layer 501 may be formed of, for example, an insulating material such as silicon oxide, silicon nitride, spin-on glass, silicon oxynitride, silicon nitride oxide, or the like. In some embodiments, the first sealing layer 501 comprises a first protruding portion 501-1 partially occupying the top portions of the spaces 401, 402, 403, 404, 405, 406. In some embodiments, the bottom end of the first protruding portion 501-1 is lower than the top end of the conductive elements 201, 202, 203, 204. In some embodiments, the bottom end of the first protruding portion 501-1 is lower than the top end of the supporting pillars 301, 302, 303. In some embodiments, the first protruding portion 501-1 is integrally formed with the first sealing layer 501 to prevent the first sealing layer 501 from peeling off from the supporting pillars 301, 302, 303 and the conductive elements 201, 202, 203, 204.

Figure 26:
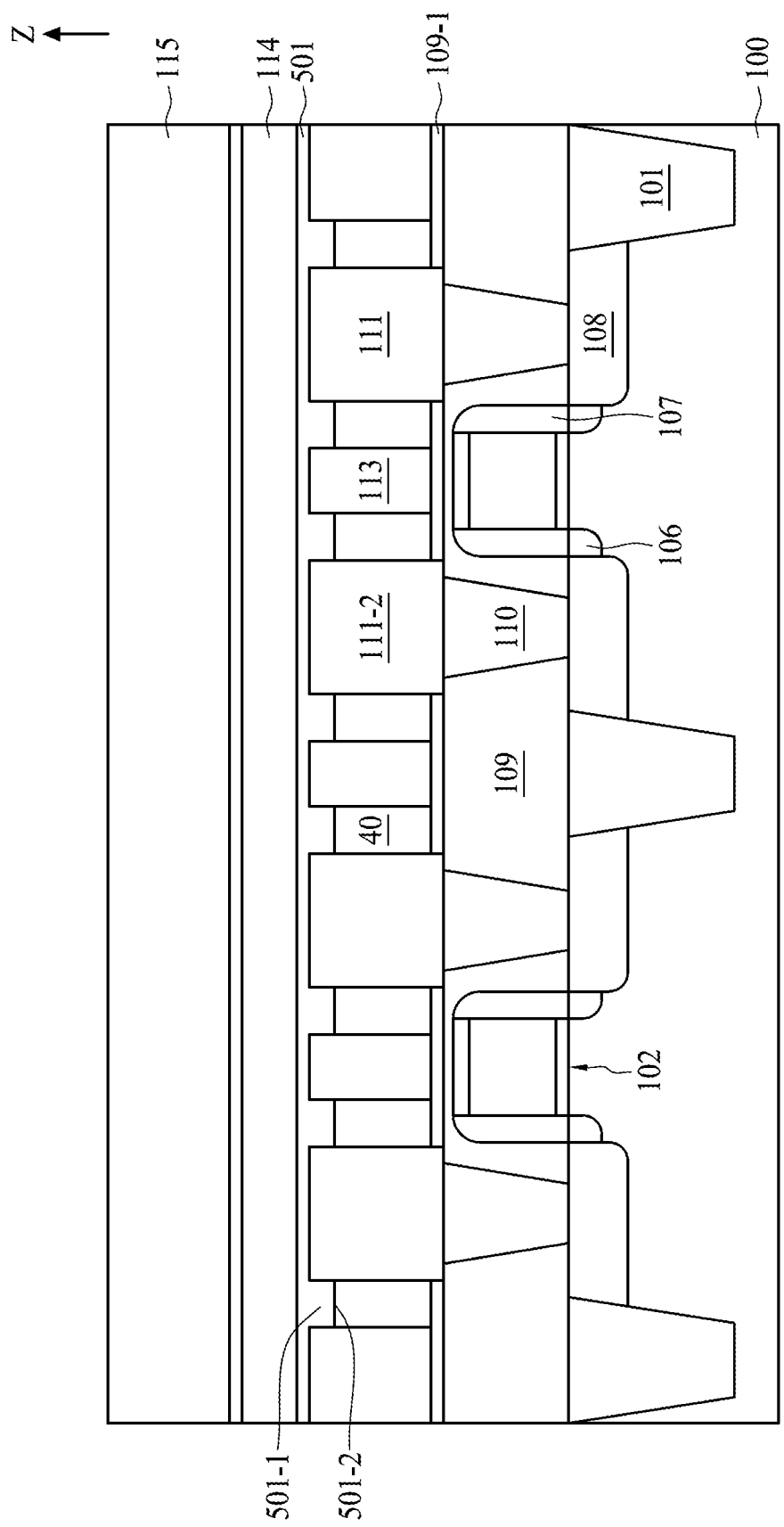

With reference to FIG. 10 and FIG. 26, at step 41, a second insulating film 114 is formed on the first sealing layer 501 and a third insulating film 115 is formed on the second insulating film 114. The second insulating film 114 is formed of, for example, silicon nitride, silicon oxide, silicon oxynitride, flow able oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. The third insulating film 115 is formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto.

Figure 27:
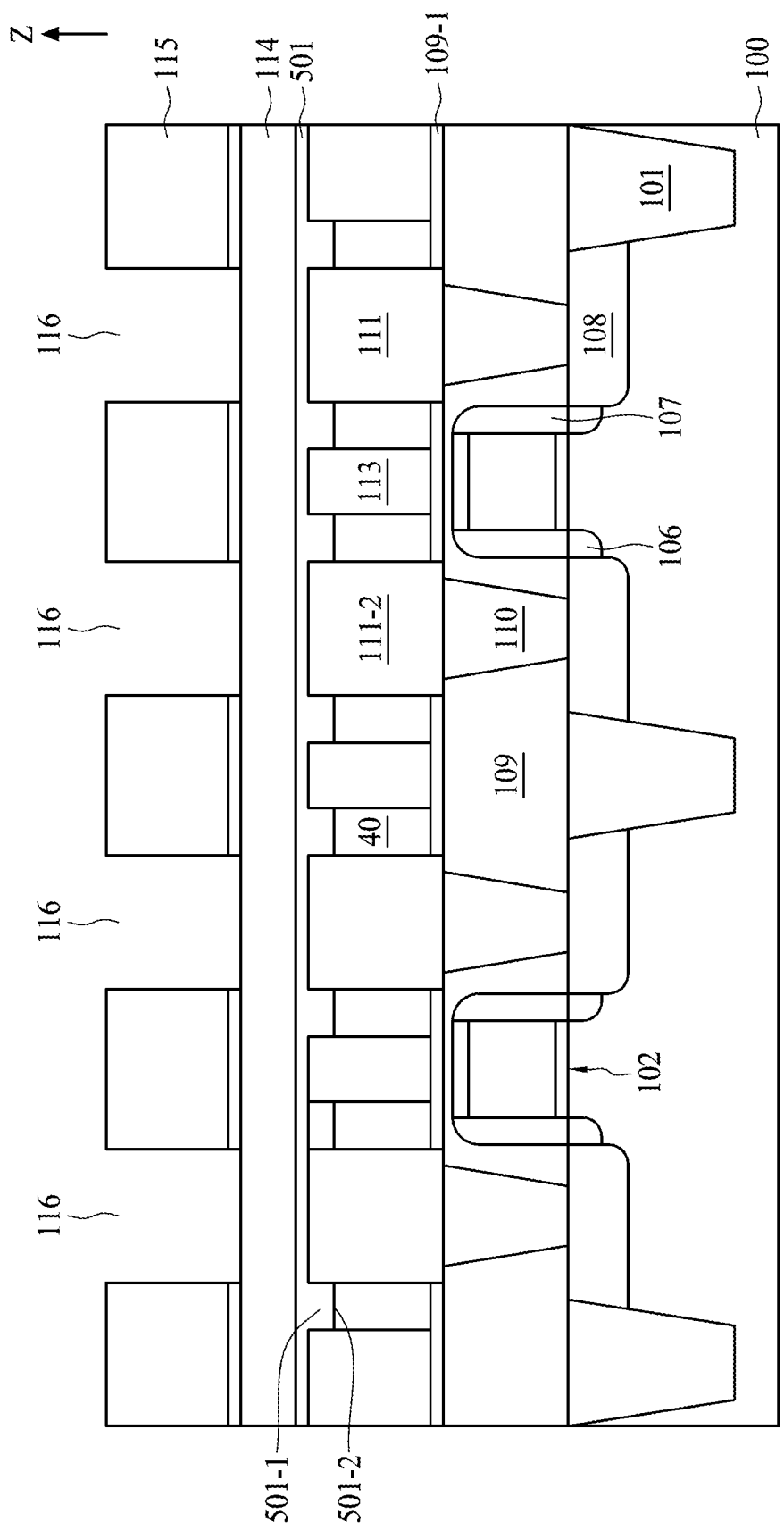

With reference to FIG. 10 and FIG. 27, at step 43, a plurality of trench openings 116 are formed in the third insulating film 115. A photolithography process may be used to pattern the third insulating film 115 to define positions of the plurality of trench openings 116. An etch process, such as an anisotropic dry etch process, may be performed after the photolithography process to form the plurality of trench openings 116 in the third insulating film 115.

Figure 28:
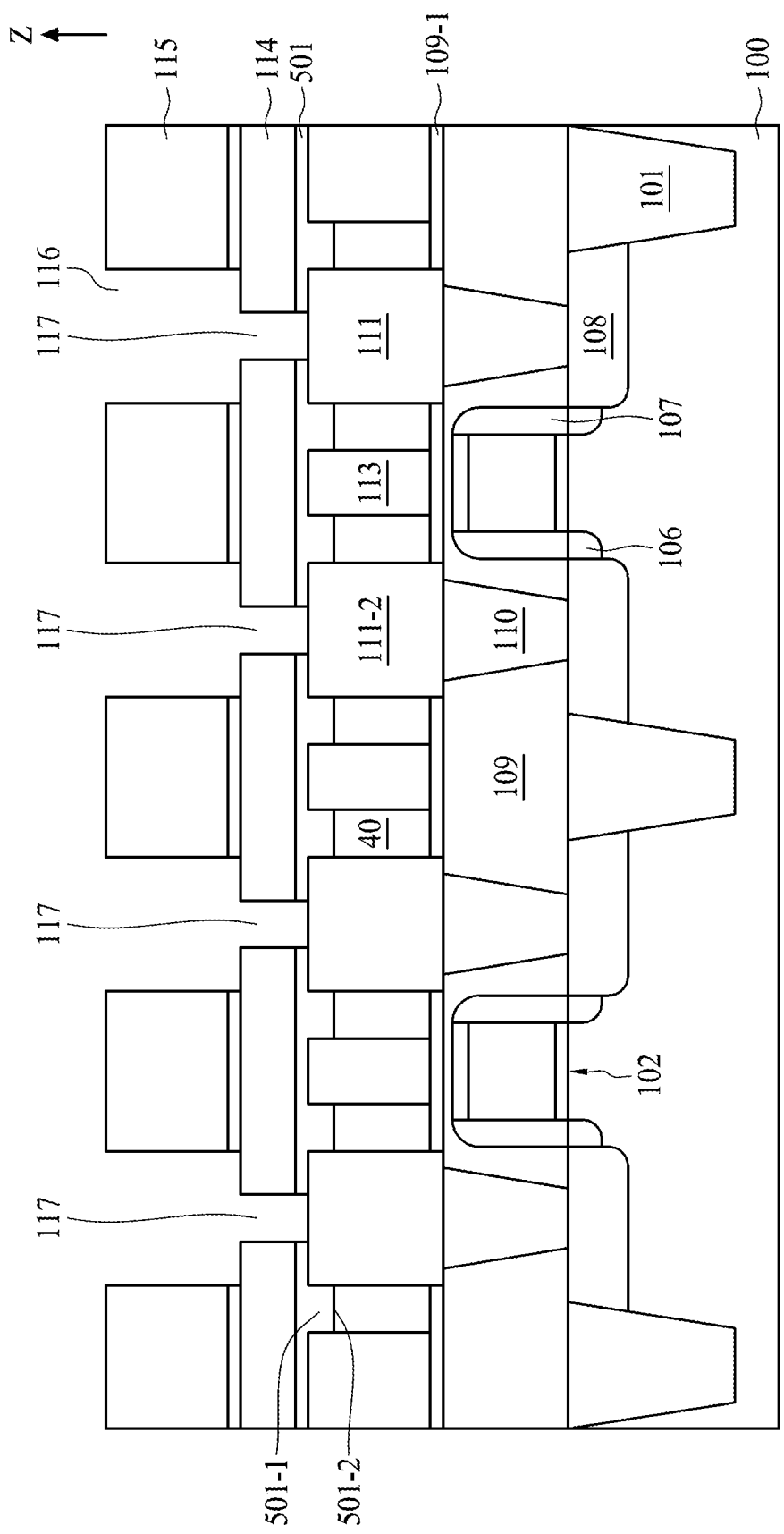

With reference to FIG. 10 and FIG. 28, at step 45, a plurality of via openings 117 are formed in the second insulating film 114. A photolithography process may be used to pattern the second insulating film 114 to define positions of the plurality of via openings 117. An etch process, such as an anisotropic dry etch process, may be performed after the photolithography process to form the plurality of via openings 117 in the second insulating film 114.

Figure 29:
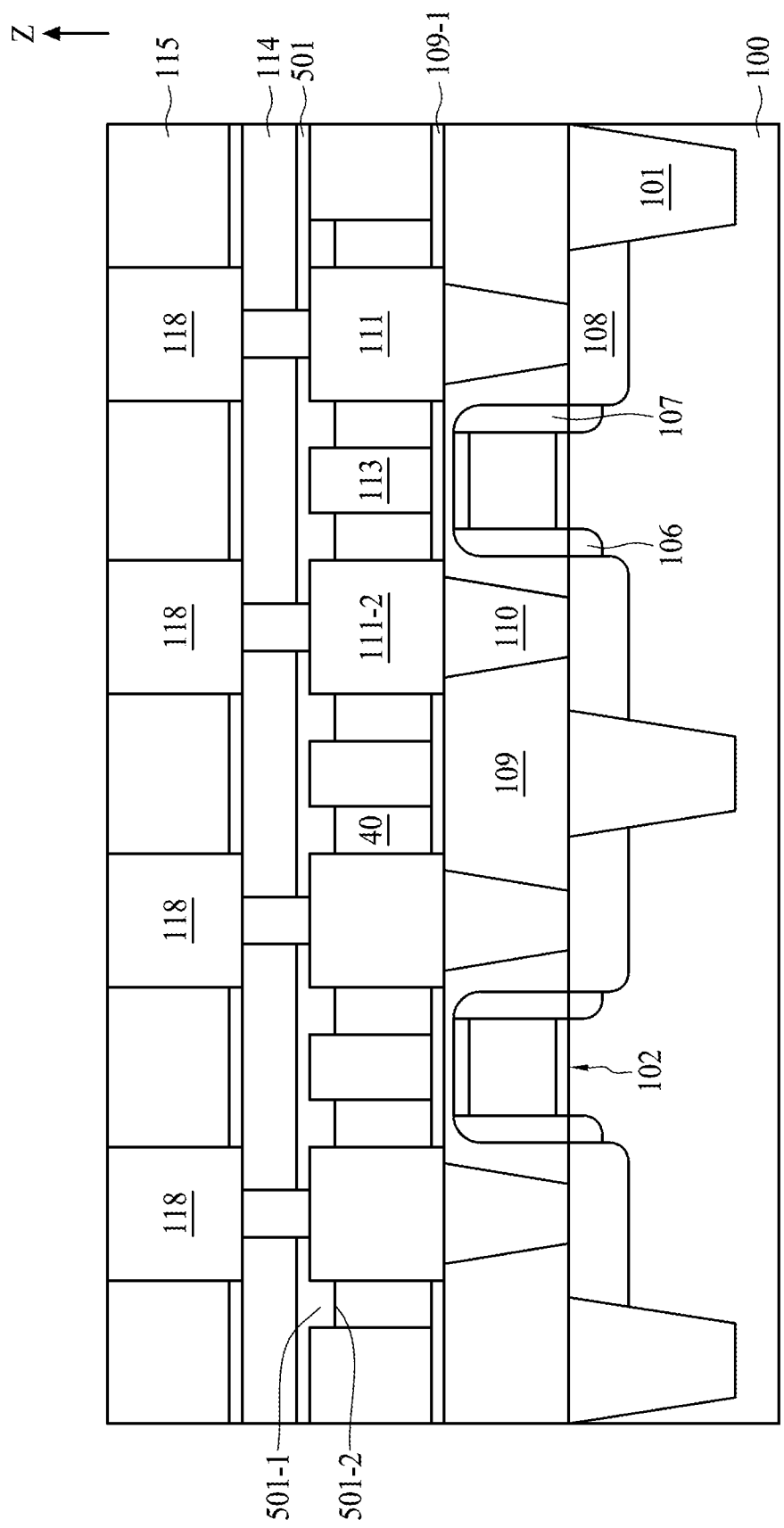

With reference to FIG. 10 and FIG. 29, at step 47, a plurality of conductive elements 118 are formed in the plurality of trench openings 116 and the plurality of via openings 117. A metallization process such as chemical vapor deposition, physical vapor deposition, sputtering, or the like may be used to fill the plurality of trench openings 116 and the plurality of via openings 117 with a conductive material, for example, aluminum, copper, tungsten, cobalt, or other suitable metal or metal alloy to form the plurality of conductive elements 118.

Figure 30:
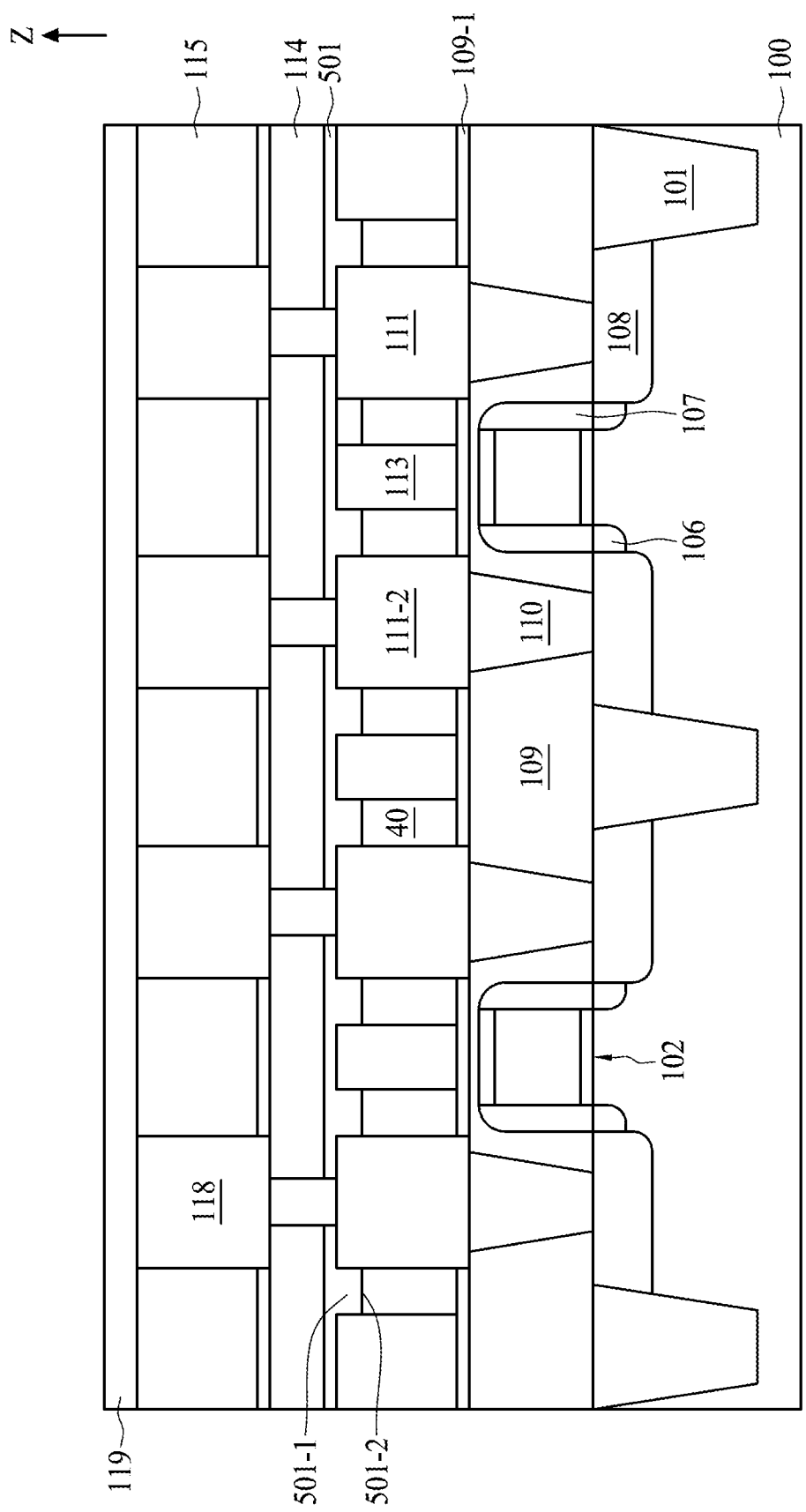

With reference to FIG. 10 and FIG. 30, at step 49, a passivation layer 119 is formed on the third insulating film 115. The passivation layer 119 may be formed with a stacked layer or a single layer using one or more of silicon oxide, silicon nitride, phosphosilica glass, or the like. The passivation layer 119 may exert a high vapor barrier in order to prevent moisture from entering from above.

Figure 31:
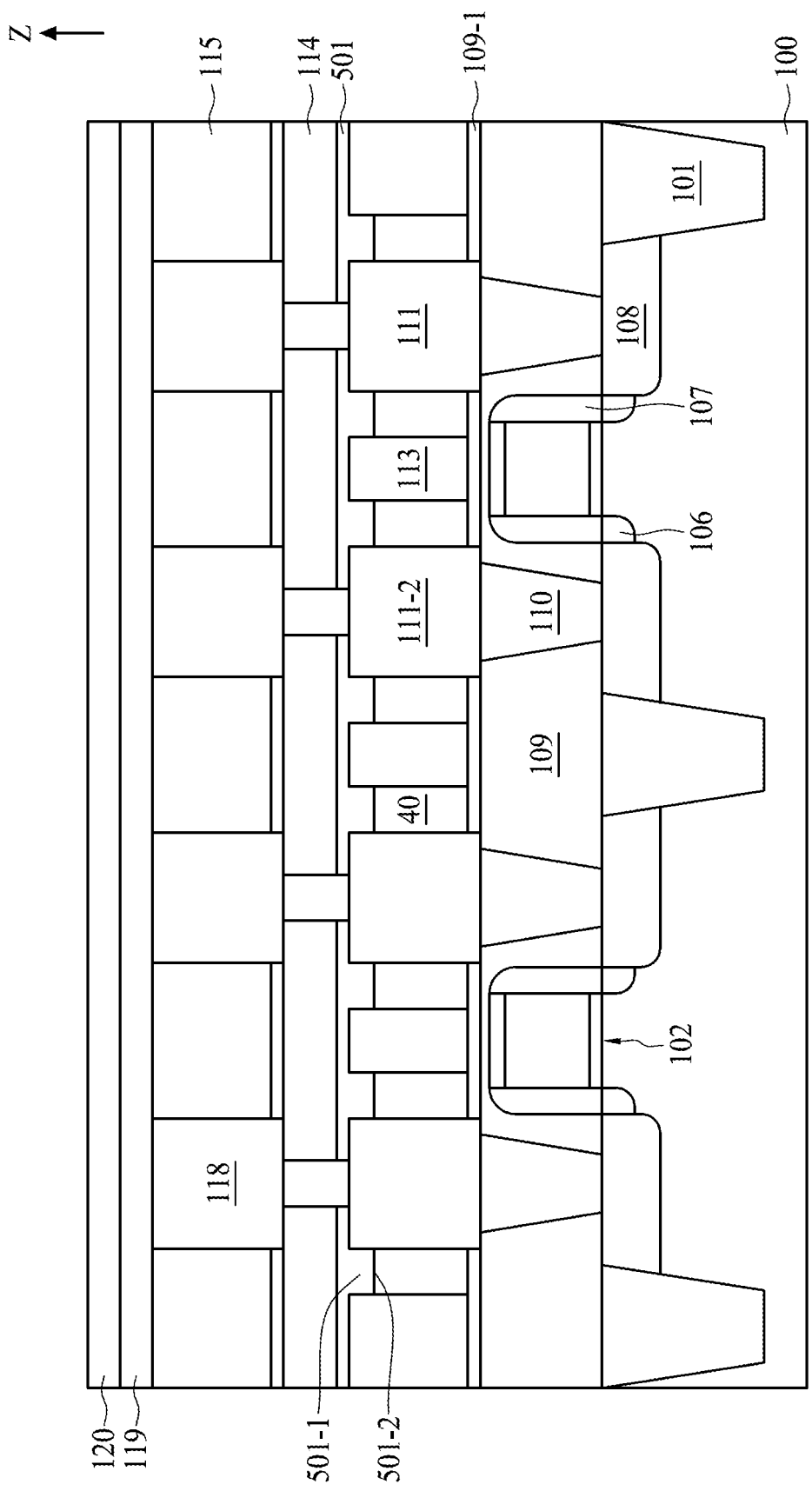

With reference to FIG. 10 and FIG. 31, at step 51, a protection layer 120 is formed on the passivation layer 119. The protection layer 120 may be formed of polyimide. The protection layer 120 may protect the layers below the protection layer 120 from mechanical scratches or background radiation.

Figure 32:
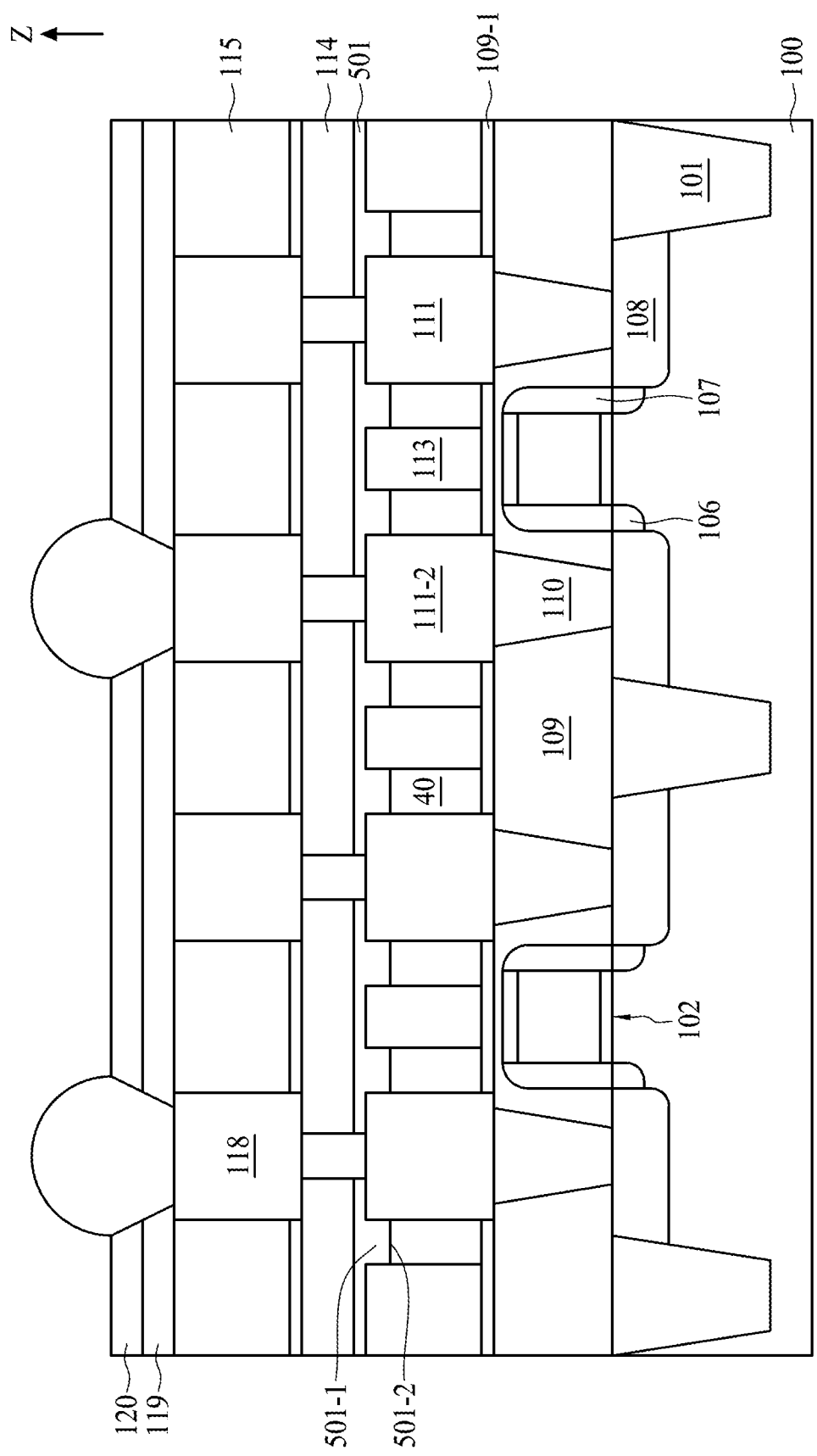

With reference to FIG. 10 and FIG. 32, at step 53, a plurality of solder units 121 are formed to pass through the protection layer 120 and the passivation layer 119 and are electrically coupled to the plurality of conductive elements 118. The plurality of solder units 121 are formed of, for example, tin-silver alloy, tin-copper alloy, or the like.

Due to the design of the semiconductor device of the present disclosure, the resistive-capacitive delay induced by the parasitic capacitance originating from adjacent conductive elements may be alleviated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
 a semiconductor substrate;
 a plurality of first set conductive elements separately positioned above the semiconductor substrate;
 a plurality of insulating blocks respectively correspondingly positioned between adjacent pairs of the plurality of first set conductive elements;
 a plurality of first set supporting pillars respectively correspondingly positioned between adjacent pairs of the plurality of first set conductive elements and respectively correspondingly positioned over the plurality of insulating blocks; and
 a plurality of spaces respectively correspondingly positioned adjacent to the plurality of first set supporting pillars and respectively correspondingly positioned over the plurality of insulating blocks,
 wherein a top end of each of the plurality of spaces is lower than top ends of the plurality of first set conductive elements and top ends of the plurality of first set supporting pillars;
 wherein each of the plurality of spaces are in contact with a sidewall of one of the plurality of first set conductive elements and a sidewall of one of the plurality of first set supporting pillars.

2. The semiconductor device of claim 1, further comprising a first sealing layer, wherein the first sealing layer is positioned above the plurality of first set conductive elements.

3. The semiconductor device of claim 2, wherein the first sealing layer is formed of silicon oxide, silicon nitride, spin-on glass, silicon oxynitride, or silicon nitride oxide.

4. The semiconductor device of claim 2, wherein the first sealing layer comprises a plurality of protrusions occupying top portions of the plurality of spaces.

5. The semiconductor device of claim 4, wherein a bottom end of the plurality of protrusions is lower than a top end of the plurality of first set conductive elements.

6. The semiconductor device of claim 1, wherein the plurality of first set conductive elements are formed of metal, metal alloy, silicate, silicide, polysilicon, or amorphous silicon.

7. The semiconductor device of claim 1, wherein the plurality of first set supporting pillars are formed of an undoped oxide.

8. The semiconductor device of claim 1, wherein a width of one of the plurality of spaces is less than or equal to one-fourth of a horizontal distance between an adjacent pair of the plurality of first set conductive elements.

9. The semiconductor device of claim 1, wherein the plurality of first set supporting pillars and the plurality of insulating blocks are made of undoped oxide.

10. The semiconductor device of claim 9, further comprising a plurality of first conductive vias, wherein the plurality of first conductive vias are disposed between the plurality of first set conductive elements and the semiconductor substrate and electrically connected to the plurality of first set conductive element, wherein a horizontal distance between one of the plurality of first conductive vias and an adjacent one of the plurality of spaces is less than about 50 nm.

11. A semiconductor device, comprising:
 a semiconductor substrate;
 a first conductive element positioned above the semiconductor substrate; a second conductive element positioned above the semiconductor substrate and separated from the first conductive element;
 an insulating block positioned above the semiconductor substrate and between the first conductive element and the second conductive element;
 a third conductive element positioned above the semiconductor substrate and opposite to the first conductive element with the second conductive element interposed therebetween;
 a first supporting pillar positioned above the insulating block and between the first conductive element and the second conductive element;
 a first space positioned above the insulating block and between the first conductive element and the first supporting pillar; and
 a second space positioned above the insulating block and between the second conductive element and the first supporting pillar,
 wherein top ends of the first space and the second space are lower than a top end of the first conductive elements and a top end of the first supporting pillar;
 wherein the first space is in contact with a sidewall of the first conductive element and a sidewall of the first supporting pillar, and the second space is in contact with a sidewall of the second conductive element and another sidewall of the first supporting pillar.

12. The semiconductor device of claim 11, wherein the first conductive element is formed of metal, metal alloy, silicate, silicide, polysilicon, or amorphous silicon.

13. The semiconductor device of claim 11, wherein the first supporting pillar and the insulating block are formed of an undoped oxide.

14. The semiconductor device of claim 11, further comprising a first sealing layer, wherein the first sealing layer is positioned above the first conductive element, the second conductive element, the third conductive element, and the first supporting pillar.

15. The semiconductor device of claim 14, wherein the first sealing layer is formed of silicon oxide, silicon nitride, spin-on glass, silicon oxynitride, or silicon nitride oxide.

16. The semiconductor device of claim 14, wherein the first sealing layer comprises a plurality of protrusions occupying top portions of the plurality of spaces.

17. The semiconductor device of claim 16, wherein a bottom end of the plurality of protrusions is lower than a top end of the plurality of first set conductive elements.

18. The semiconductor device of claim 11, wherein a width of the first space is less than or equal to one-fourth of a horizontal distance between the first conductive element and the second conductive element.

* * * * *